US012660559B2

(12) United States Patent
Sakamoto et al.

(10) Patent No.: US 12,660,559 B2
(45) Date of Patent: *Jun. 16, 2026

(54) INSPECTION DEVICE AND INSPECTION METHOD

(71) Applicant: HAMAMATSU PHOTONICS K.K.,
Hamamatsu (JP)

(72) Inventors: Takeshi Sakamoto, Hamamatsu (JP);
Takafumi Ogiwara, Hamamatsu (JP);
Iku Sano, Hamamatsu (JP)

(73) Assignee: HAMAMATSU PHOTONICS K.K.,
Hamamatsu (JP)

( * ) Notice: Subject to any disclaimer, the term of this
patent is extended or adjusted under 35
U.S.C. 154(b) by 525 days.

This patent is subject to a terminal dis-
claimer.

(21) Appl. No.: 17/908,293

(22) PCT Filed: Mar. 3, 2021

(86) PCT No.: PCT/JP2021/008240
§ 371 (c)(1),
(2) Date: Aug. 31, 2022

(87) PCT Pub. No.: WO2021/177364

PCT Pub. Date: Sep. 10, 2021

(65) Prior Publication Data

US 2023/0113051 A1 Apr. 13, 2023

(30) Foreign Application Priority Data

Mar. 6, 2020 (JP) ................................. 2020-039067

(51) Int. Cl.
*H10P 72/00* (2026.01)
*H10P 74/20* (2026.01)
(52) U.S. Cl.
CPC ...... *H10P 72/0614* (2026.01); *H10P 72/0604*
(2026.01); *H10P 74/203* (2026.01)

(58) Field of Classification Search
CPC ......... H01L 21/67282; H01L 21/67253; H01L
22/12
See application file for complete search history.

(56) References Cited

U.S. PATENT DOCUMENTS

2009/0035879 A1 2/2009 Sakaya
2011/0037149 A1 2/2011 Fukuyo et al.

FOREIGN PATENT DOCUMENTS

CN 101461039 A 6/2009
JP 2009-152288 A 7/2009
(Continued)

OTHER PUBLICATIONS

International Preliminary Report on Patentability mailed Sep. 15,
2022 for PCT/JP2021/008240.

*Primary Examiner* — Mohammad M Choudhry
(74) *Attorney, Agent, or Firm* — Faegre Drinker Biddle &
Reath LLP

(57) ABSTRACT

This inspection device includes: a laser irradiation unit that
irradiates a wafer having a back surface and a front surface
with a laser beam from the back surface side of the wafer;
an imaging unit that outputs light having permeability to the
wafer and detects the light propagating through the wafer;
and a control part configured to perform a first process of
controlling the laser irradiation unit so that a modified region
is formed inside the wafer by irradiating the wafer with the
laser beam and a second process of deriving a position of the
modified region on the basis of a signal output from the
imaging unit that detects the light and deriving a thickness
of the wafer on the basis of the derived position of the
modified region and a set recipe.

5 Claims, 28 Drawing Sheets

(56) References Cited

FOREIGN PATENT DOCUMENTS

| JP | 2014099521 | A | * | 5/2014 |
|----|------------|---|---|--------|
| JP | 2015012015 |   | * | 1/2015 |
| JP | 2016-107334 | A |  | 6/2016 |
| JP | 2017-064746 | A |  | 4/2017 |
| JP | 2017-133997 | A |  | 8/2017 |
| JP | 2018-063148 | A |  | 4/2018 |
| JP | 2019-158811 | A |  | 9/2019 |
| TW | 201637763 | A |  | 11/2016 |

* cited by examiner

*Fig.9*
(a)
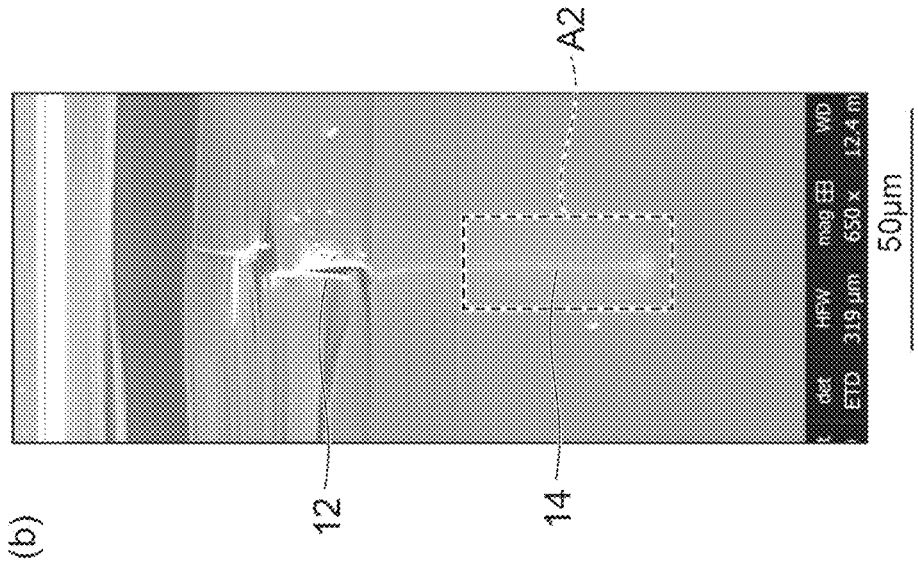
(b)
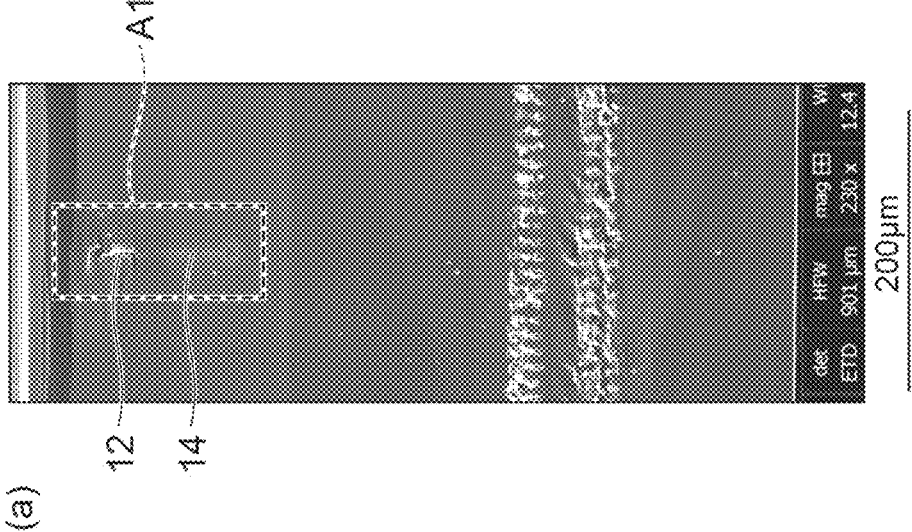

*Fig.11*
(a)
 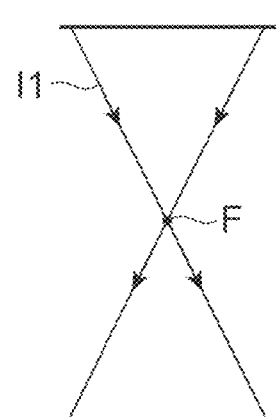 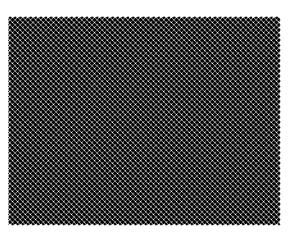
(b)
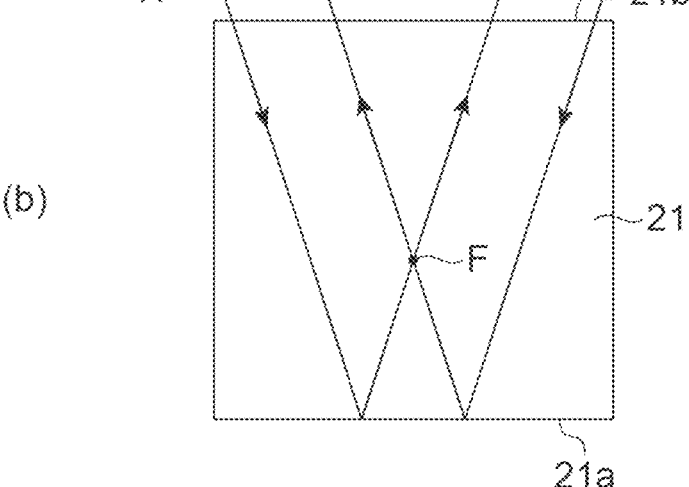 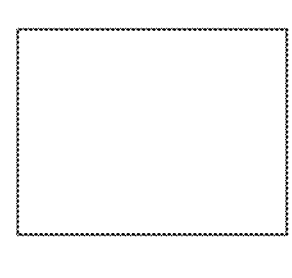
(c)
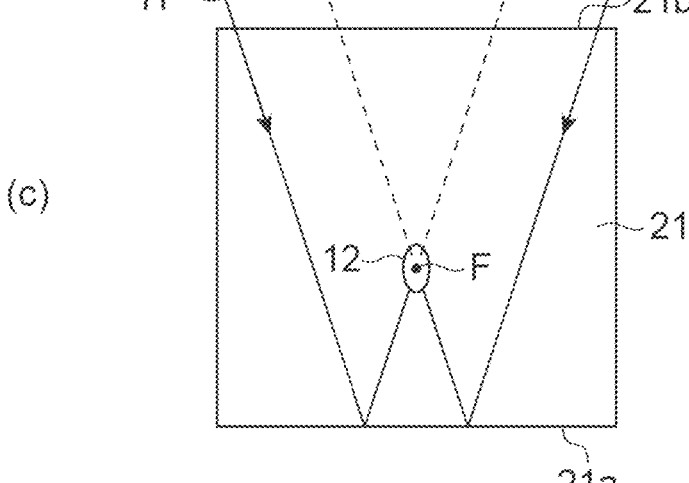 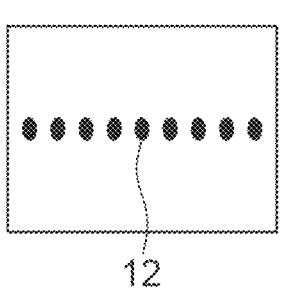

*Fig.12*
(a)
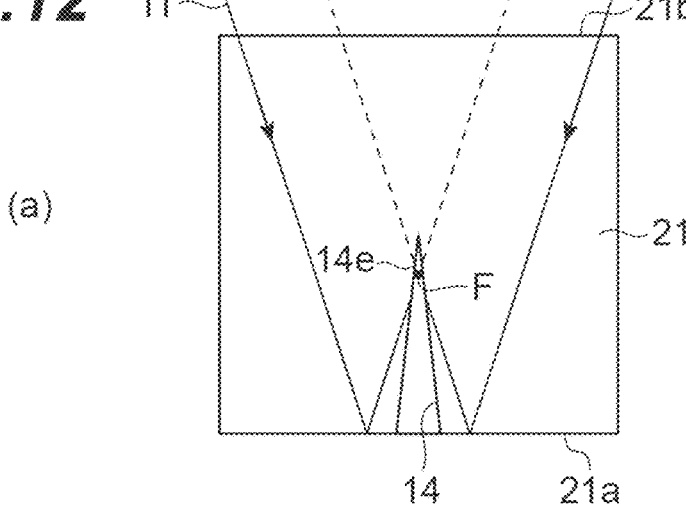
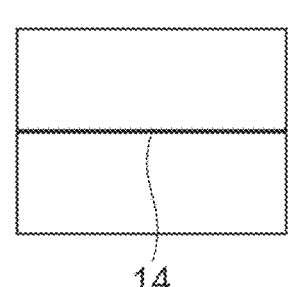
(b)
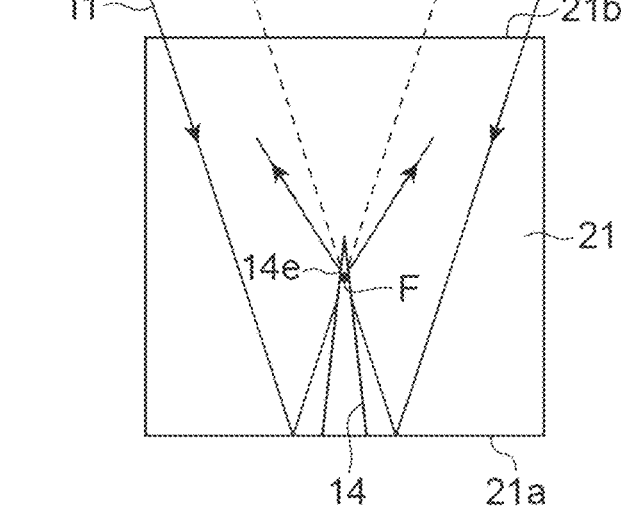
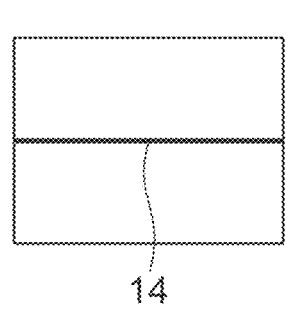
(c)
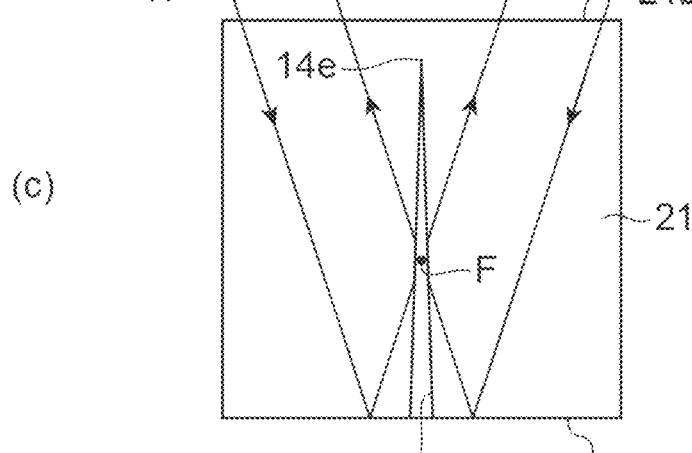
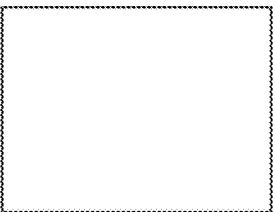

*Fig.16*
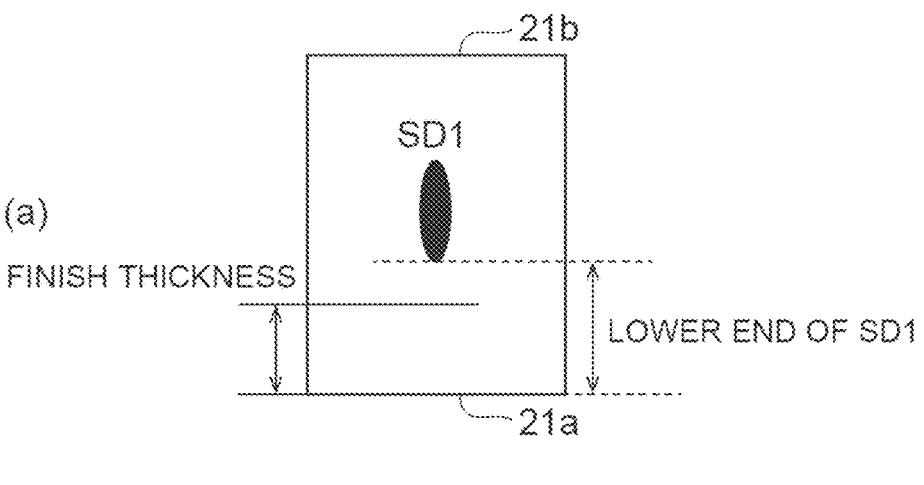
(a)
FINISH THICKNESS
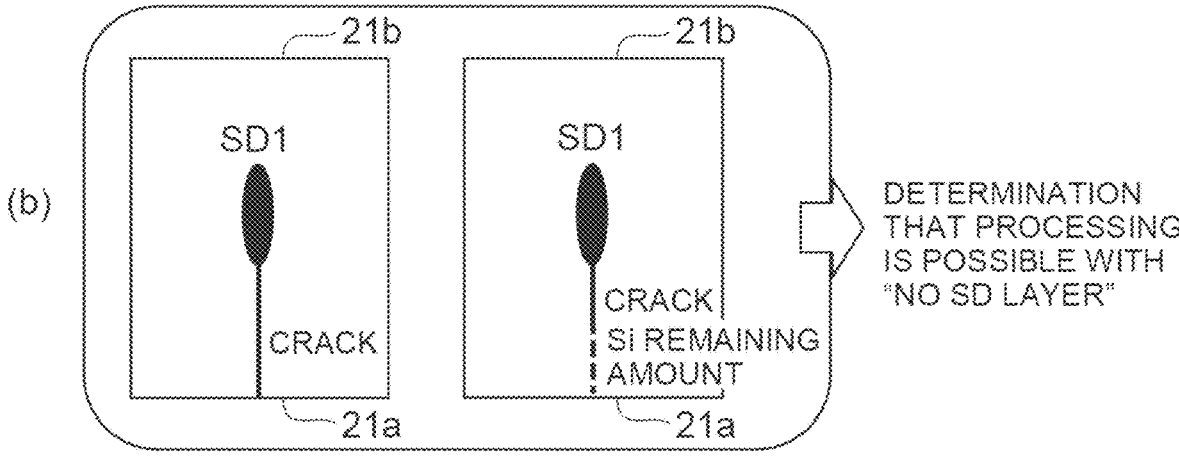
(b)
DETERMINATION
THAT PROCESSING
IS POSSIBLE WITH
"NO SD LAYER"
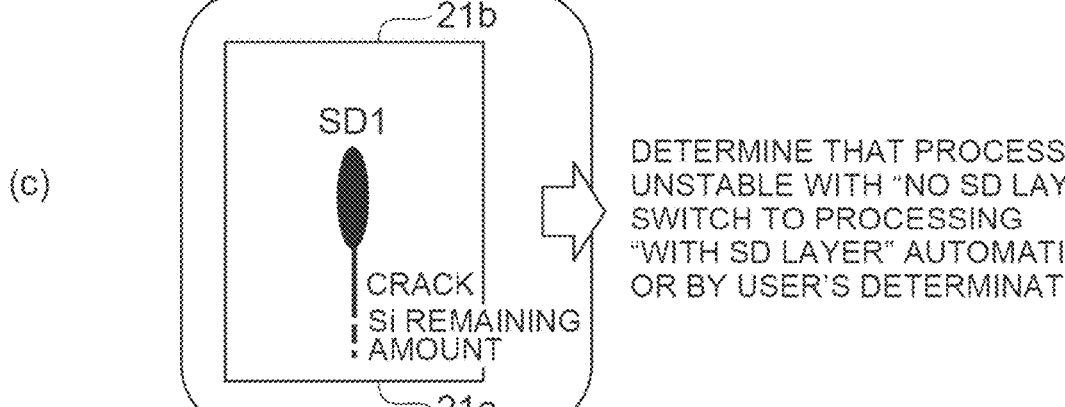
(c)
DETERMINE THAT PROCESSING IS
UNSTABLE WITH "NO SD LAYER",
SWITCH TO PROCESSING
"WITH SD LAYER" AUTOMATICALLY
OR BY USER'S DETERMINATION

Fig.17

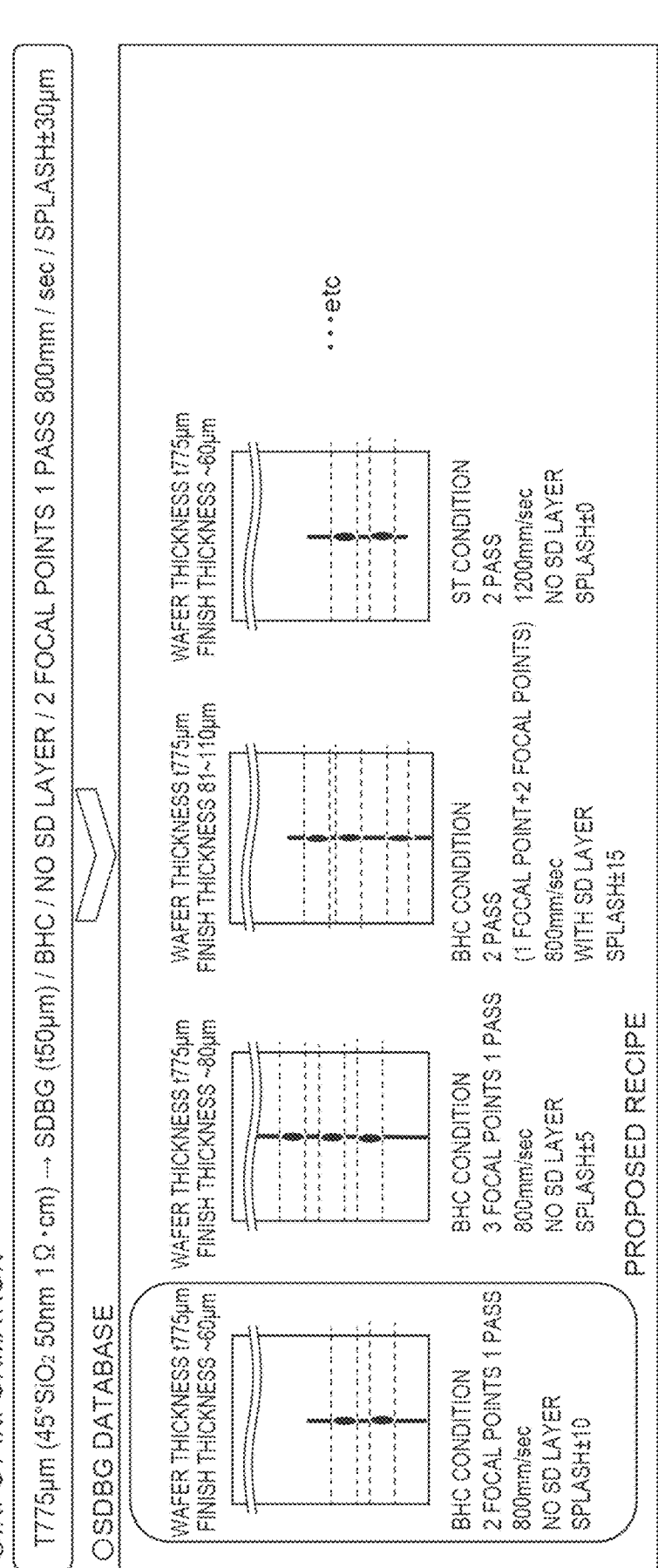

○INPUT INFORMATION

T775μm (45°SiO₂ 50nm 1Ω・cm) → SDBG (t50μm) / BHC / NO SD LAYER / 2 FOCAL POINTS 1 PASS 800mm / sec / SPLASH±30μm

○SDBG DATABASE

WAFER THICKNESS t775μm
FINISH THICKNESS ~60μm

BHC CONDITION
2 FOCAL POINTS 1 PASS
800mm/sec
NO SD LAYER
SPLASH±10

WAFER THICKNESS t775μm
FINISH THICKNESS ~80μm

BHC CONDITION
3 FOCAL POINTS 1 PASS
800mm/sec
NO SD LAYER
SPLASH±5

WAFER THICKNESS t775μm
FINISH THICKNESS 81~110μm

BHC CONDITION
2 PASS
(1 FOCAL POINT+2 FOCAL POINTS)
800mm/sec
WITH SD LAYER
SPLASH±15

WAFER THICKNESS t775μm
FINISH THICKNESS ~60μm

ST CONDITION
2 PASS
1200mm/sec
NO SD LAYER
SPLASH±0

・・・etc

PROPOSED RECIPE

*Fig.23*

| PROCESSING CONDITION No. | 1 | 2 | 3 | 4 | 5 | 6 | 7 | 8 | 9 | 10 | 11 | ... |
|---|---|---|---|---|---|---|---|---|---|---|---|---|
| ENERGY (μJ) | 21.7 | 21.7 | 21.7 | 16.7 | 26.7 | 21.7 | 21.7 | 21.7 | 21.7 | 21.7 | 21.7 | |
| PULSE WAVEFORM(—) | 1 | 1 | 1 | 1 | 1 | 1 | 1 | 1 | 1 | 2 | 3 | |
| PULSE PITCH | 5 | 6.7 | 8.3 | 6.7 | 6.7 | 6.7 | 6.7 | 6.7 | 6.7 | 6.7 | 6.7 | |
| LIGHT CONCENTRATION STATE(A) | -3 | -3 | -3 | -3 | -3 | -3 | -3 | -3 | -3 | -3 | -3 | |
| LIGHT CONCENTRATION STATE(B) | 6 | 6 | 6 | 6 | 6 | 6 | 6 | 3 | 9 | 6 | 6 | |
| WIDTH OF SD LAYER(μm) | 25 | 23.5 | 20.5 | 21 | 26.5 | 22.5 | 25 | 24.5 | 21 | 20.5 | 19 | |

*Fig.25*

○INPUT INFORMATION

T775μm (45°SiO₂ 50nm 1Ω・cm) → SDBG (t50μm) / BHC / NO SD LAYER / 1 FOCAL POINTS 2 PASS 800mm / sec / SPLASH±30μm ○ESTIMATION PROCESSING RESULT IMAGE    ○INSPECTION DETERMINATION RESULT    ○RECIPE AFTER CORRECTION

Left diagram:

WAFER THICKNESS 21b
t775μm

- D:246μm
- C:171μm
- C:140μm
- C:92μm
- C:65μm
- 0μm

12b

B: NO BLACK STREAKS

12a FINISH THICKNESS

50μm

14

A:BHC STATE   21a

Right diagram:

E:WAFER THICKNESS 21b
t783μm

- D:244μm
- C:173μm
- C:142μm
- C:93μm
- C:64μm
- 0μm

12b

B: NO BLACK STREAKS

12b FINISH THICKNESS

50μm

14

A:BHC STATE   21a

Recipe:

・LASER CONDITION
WAVELENGTH 1099nm
PULSE WIDTH LEVEL 7
FREQUENCY 120kHz
800mm/sec (p.p. 6.75μm)

・PROCESSING POINT SETTING / LBA SETTING
2 FOCAL POINT PROCESSING
VD DISTANCE 18
SD1 Z175 2.8W LIGHT CONCENTRATION LEVEL-2
SD2 Z157 2.8W LIGHT CONCENTRATION LEVEL-2

RETURN     PROCESSING CONDITION DETERMINATION

150

1

INSPECTION DEVICE AND INSPECTION METHOD

TECHNICAL FIELD

One aspect of the present invention relates to an inspection device and an inspection method.

BACKGROUND ART

In order to cut a wafer including a semiconductor substrate and a functional element layer formed on one surface of the semiconductor substrate along each of a plurality of lines, an inspection device that forms a plurality of rows of modified regions inside the semiconductor substrate along each of the plurality of lines by irradiating the wafer with a laser beam from the other surface side of the semiconductor substrate is known. An inspection device described in Patent Literature 1 includes an infrared camera and can observe a modified region formed inside a semiconductor substrate, processing damage formed on the functional element layer, and the like from the back surface side of the semiconductor substrate.

CITATION LIST

Patent Literature

[Patent Literature 1] Japanese Unexamined Patent Publication No. 2017-64746

SUMMARY OF INVENTION

Technical Problem

In the inspection device as described above, it is necessary to accurately input a wafer thickness, for example, when processing conditions are determined. However, for example, when an unknown wafer is used, the wafer thickness cannot be input accurately, and there is a possibility that the inspection cannot be performed accurately.

One aspect of the present invention has been made in view of the above circumstances, and an object of the present invention is to provide an inspection device and an inspection method capable of deriving the thickness of a wafer with high accuracy.

Solution to Problem

An inspection device according to one aspect of the present invention includes an irradiation unit configured to irradiate a wafer having a first surface and a second surface with a laser beam from a first surface side of the wafer, an imaging unit configured to output light having permeability to the wafer and to detect the light propagating through the wafer, and a control part configured to perform a first process of controlling the irradiation unit so that a modified region is formed inside the wafer by irradiating the wafer with the laser beam, and a second process of deriving a position of the modified region based on a signal output from the imaging unit that has detected the light and deriving a thickness of the wafer based on the derived position of the modified region and set processing conditions.

In the inspection device according to the aspect of the present invention, the thickness of the wafer is derived based on the position of the modified region formed by irradiating the wafer with the laser beam and set processing conditions.

2

The position of the modified region is determined based on the processing conditions and the thickness of the wafer. Therefore, when the position of the modified region and the processing conditions are known, it is possible to derive the thickness of the wafer. As in the inspection device according to the aspect of the present invention, the thickness of the wafer can be derived with high accuracy by deriving the thickness of the wafer from the position of the actually imaged modified region and the set processing conditions.

In the second process, the control part may derive a position of a virtual image of an end portion of the modified region on a second surface side based on a signal output from the imaging unit that has detected the light and may derive a thickness of the wafer based on the position of the virtual image and the processing conditions. In order to derive the position of the modified region, it is necessary to derive the position of the end portion of the modified region on the second surface side. However, when the laser beam is radiated from the first surface side of the wafer, the position cannot be confirmed even when the position of the end portion of the modified region on the second surface side is focused. In this respect, since the position of the virtual image of the end portion of the modified region on the second surface side can be derived, the position of the modified region can be estimated based on the position of the virtual image. Thus, the thickness of the wafer can be appropriately derived.

In the second process, the control part may further derive a position of an end portion of the modified region on the first surface side based on the signal output from the imaging unit that has detected the light, further derive a width of the modified region based on the processing conditions, and may derive a thickness of the wafer based on the position of the virtual image of the end portion of the modified region on the second surface side, the position of the end portion of the modified region on the first surface side, and the width of the modified region. The total of the position of the virtual image of the end portion of the modified region on the second surface side, the position of the end portion thereof on the first surface side, and the width of the modified region is twice the thickness of the wafer. Therefore, the thickness of the wafer can be appropriately derived by deriving the position of the virtual image of the end portion of the modified region on the second surface side, the position of the end portion thereof on the first surface side, and the width of the modified region.

The control part may store a database in which the processing conditions and the width of the modified region are associated with each other, and in the second process, the control part may derive the width of the modified region corresponding to the processing conditions by referring to the database. Since the width of the modified region is changed according to the processing conditions, the width of the modified region can be easily and highly accurately derived by deriving the width of the modified region by referring to the database in which the width of the modified region and the processing conditions are associated with each other.

In the second process, the control part may derive a constant consideration end position based on an estimated position of the end portion that is a position of the end portion of the modified region on the second surface side and is estimated from a processing depth of the laser beam with respect to the wafer, and a constant considering a refractive index of the wafer which are included in the processing condition, and may derive a thickness of the wafer based on the position of the virtual image of the end portion of the modified region on the second surface side and the position of the constant consideration end position. The total of the value considering the refractive index of the wafer for the position of the end portion of the modified region on the second surface side which is estimated from the processing depth of the laser beam included in the processing conditions (constant consideration end position), and the position of the virtual image of the end portion of the modified region on the second surface side is twice the thickness of the wafer. Therefore, the thickness of the wafer can be appropriately derived by deriving the position of the virtual image of the end portion of the modified region on the second surface side and the constant consideration end position.

An inspection method according to another aspect of the present invention includes a first step of preparing a wafer having a first surface and a second surface and forming a modified region inside the wafer by irradiating the wafer with a laser beam, a second step of outputting light having permeability to the wafer in which the modified region is formed by the first step and detecting light propagating through the wafer, and a third step of deriving a position of the modified region based on the light detected in the second step, and deriving a thickness of the wafer based on the derived position of the modified region and set processing conditions.

Advantageous Effects of Invention

According to the inspection device and the inspection method according to one aspect of the present invention, a thickness of a wafer can be derived with high accuracy.

BRIEF DESCRIPTION OF DRAWINGS

FIG. 9 is an SEM image of a modified region and a crack formed inside a semiconductor substrate.

FIG. 11 is an optical path diagram for describing the imaging principle of the inspection imaging unit shown in FIG. 5, and a schematic diagram showing an image at a focal point by the inspection imaging unit.

FIG. 12 is an optical path diagram for describing the imaging principle of the inspection imaging unit shown in FIG. 5, and a schematic diagram showing an image at a focal point by the inspection imaging unit.

4

Figure 13:
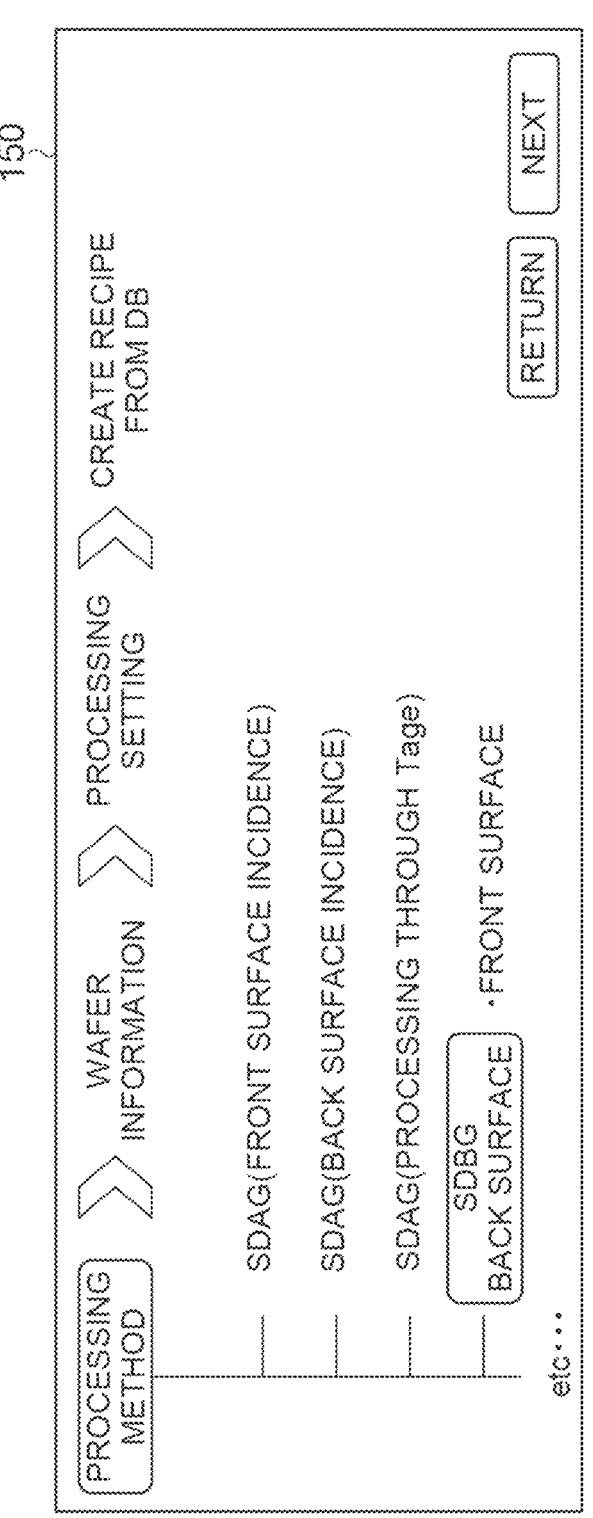

FIG. 13 is an example of a setting screen of wafer processing information.

Figure 14:
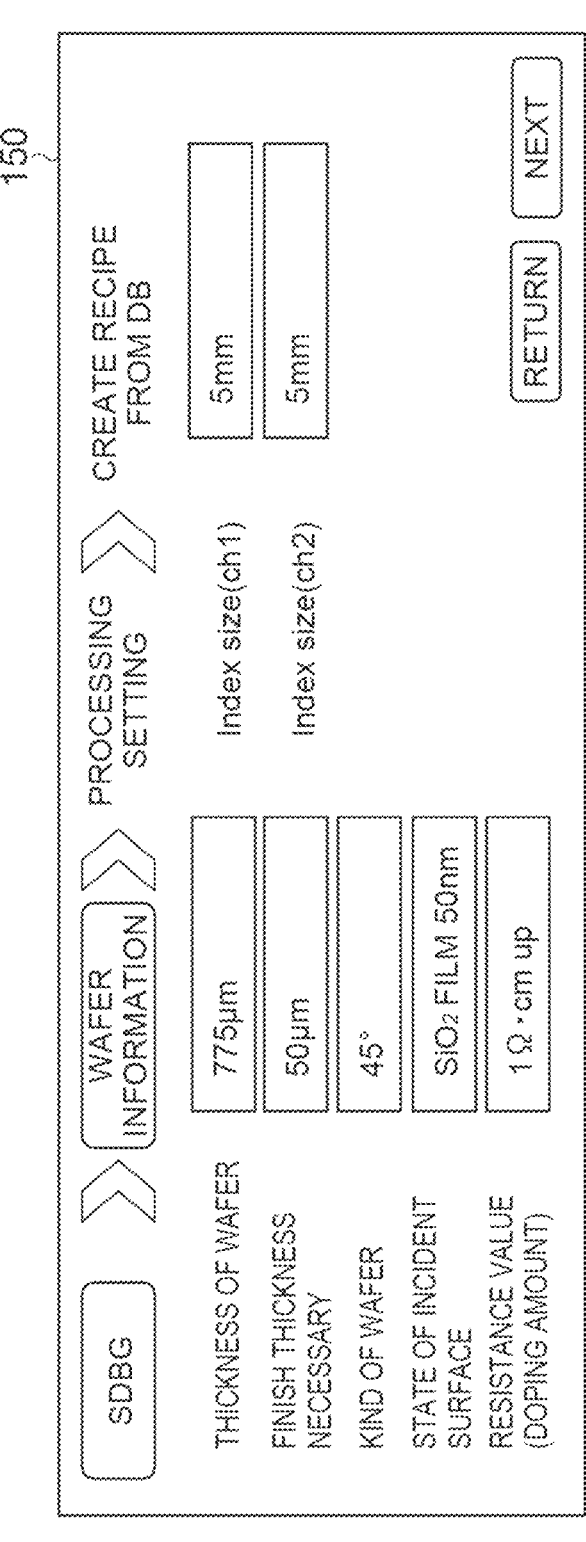

FIG. 14 is an example of the setting screen of the wafer processing information.

Figure 15:
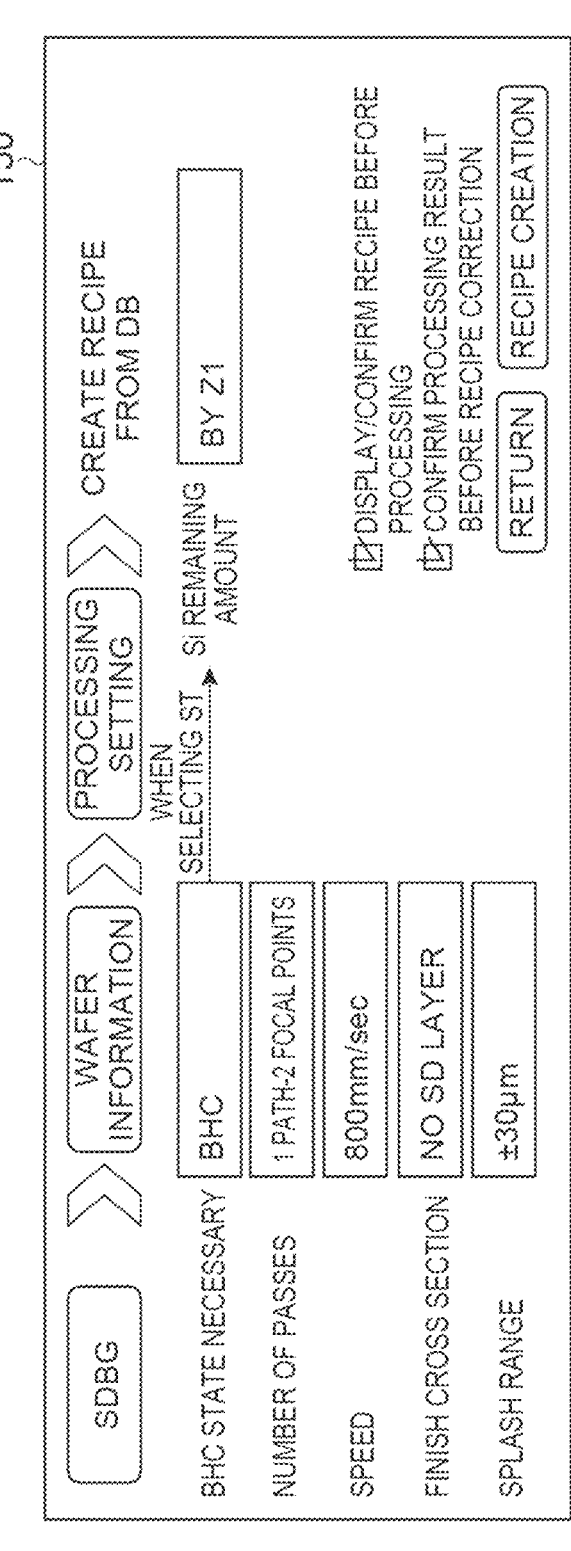

FIG. 15 is an example of the setting screen of the wafer processing information.

FIG. 16 is a diagram showing setting of a finish cross section.

FIG. 17 is a diagram showing selection of a recipe from a database.

Figure 18:
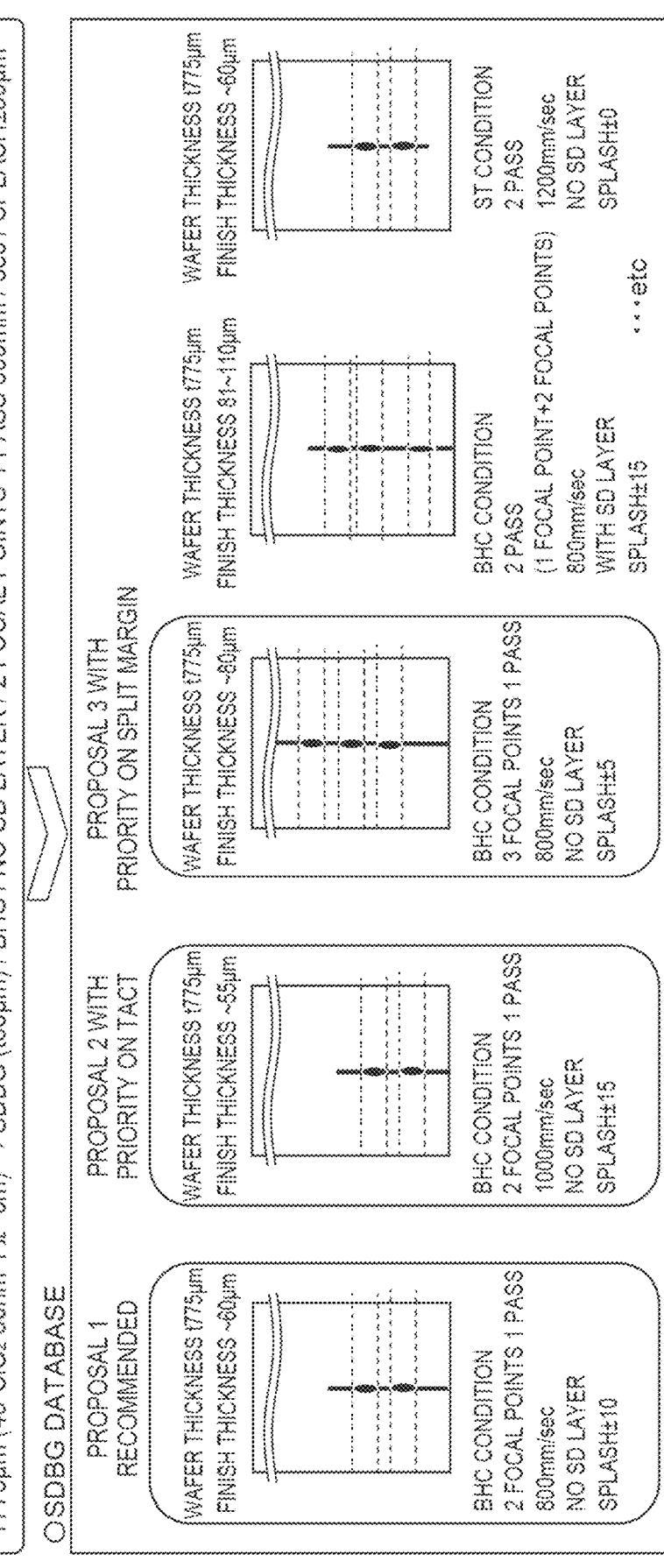

FIG. 18 is a diagram showing selection of a plurality of recipes from the database.

Figure 19:
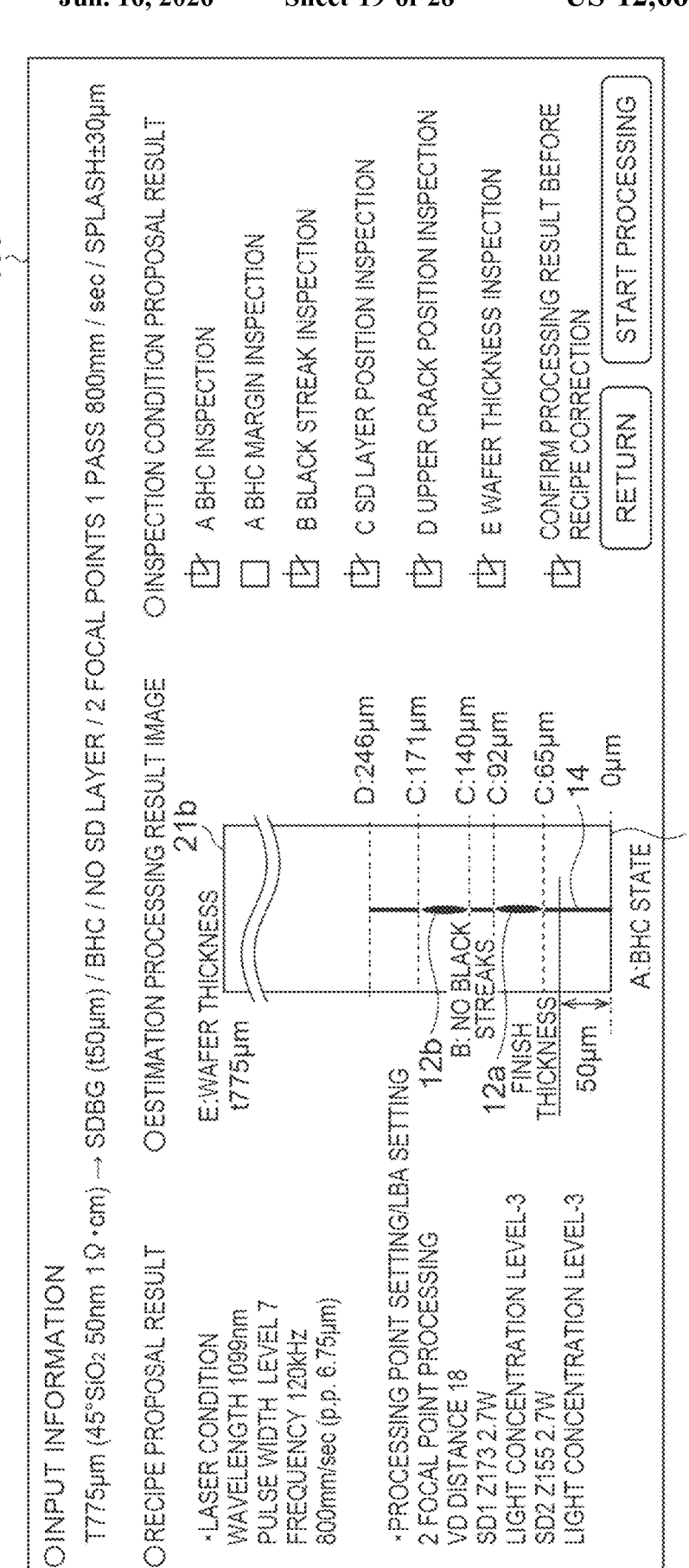

FIG. 19 is an example of a display screen of an estimation processing result image.

Figure 20:
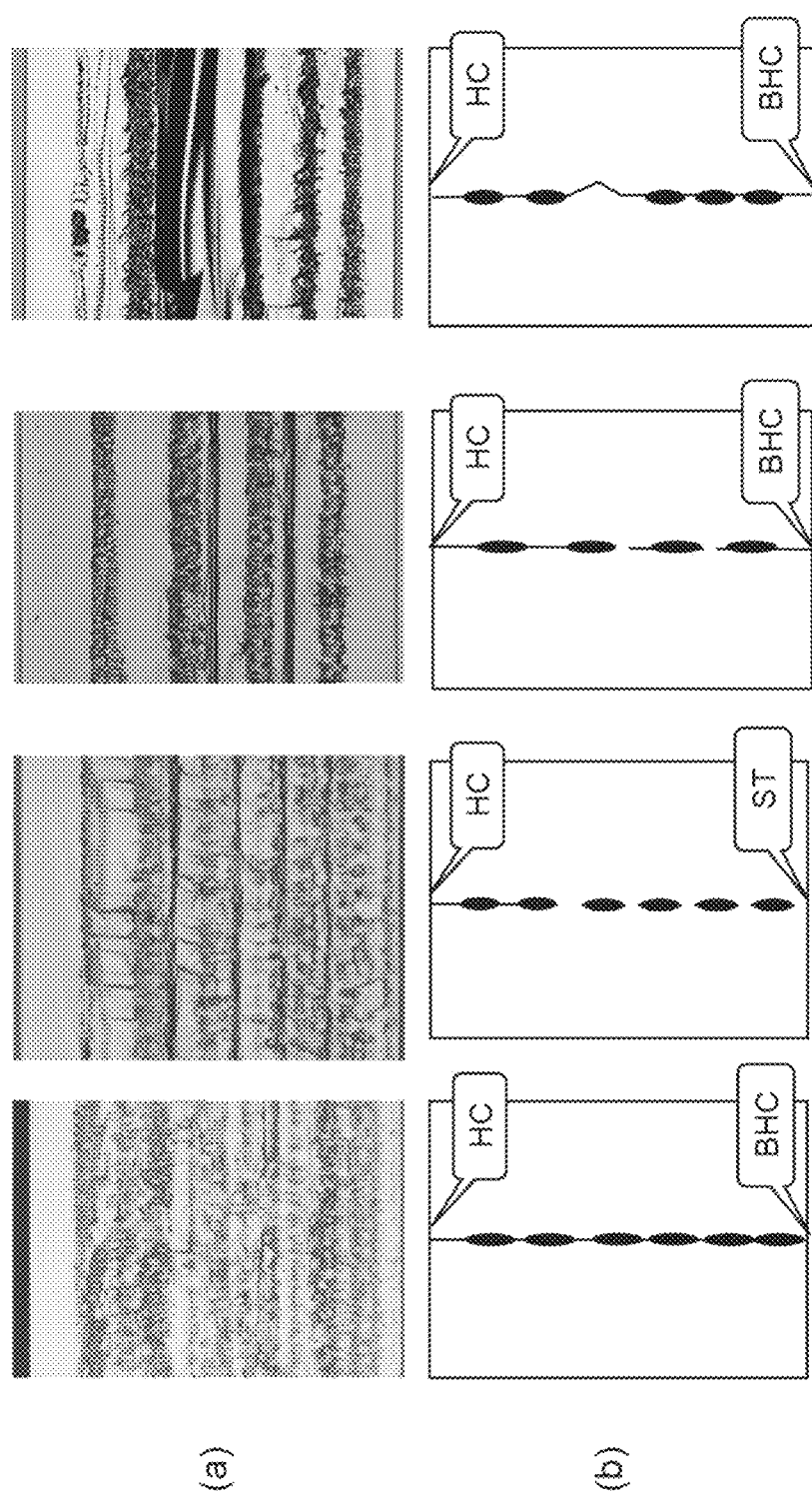

FIG. 20 is a diagram describing the estimation processing result image.

Figure 21:
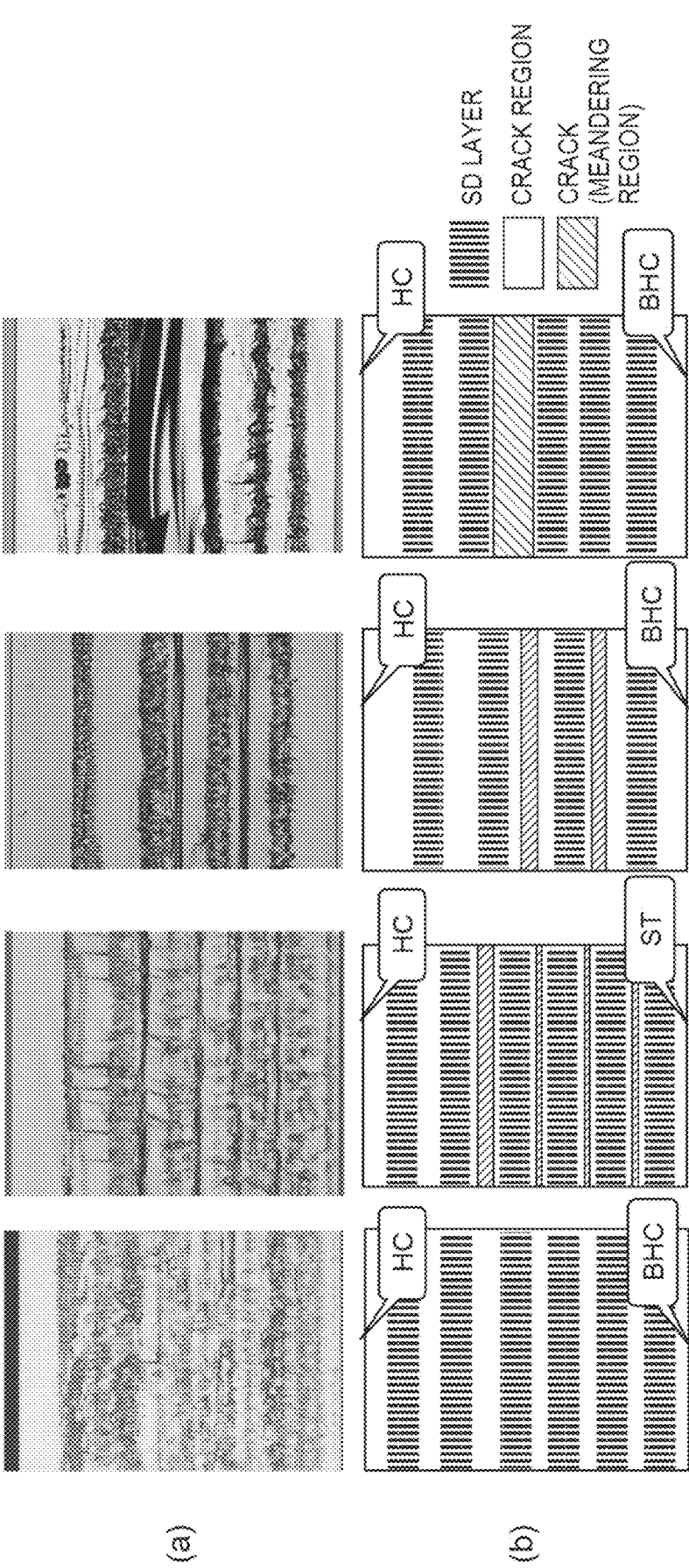

FIG. 21 is a diagram describing the estimation processing result image.

Figure 22:
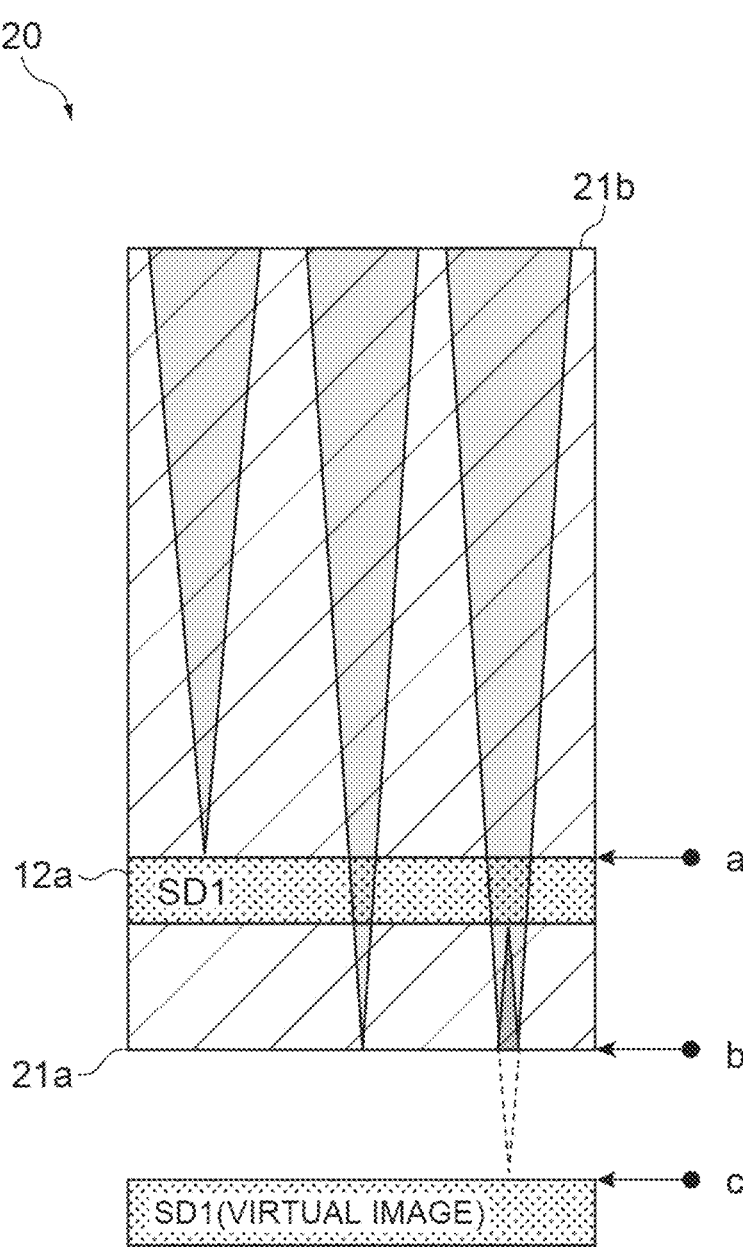

FIG. 22 is a diagram showing a derivation of a wafer thickness.

FIG. 23 is an example of the database relating to the derivation of the wafer thickness.

Figure 24:
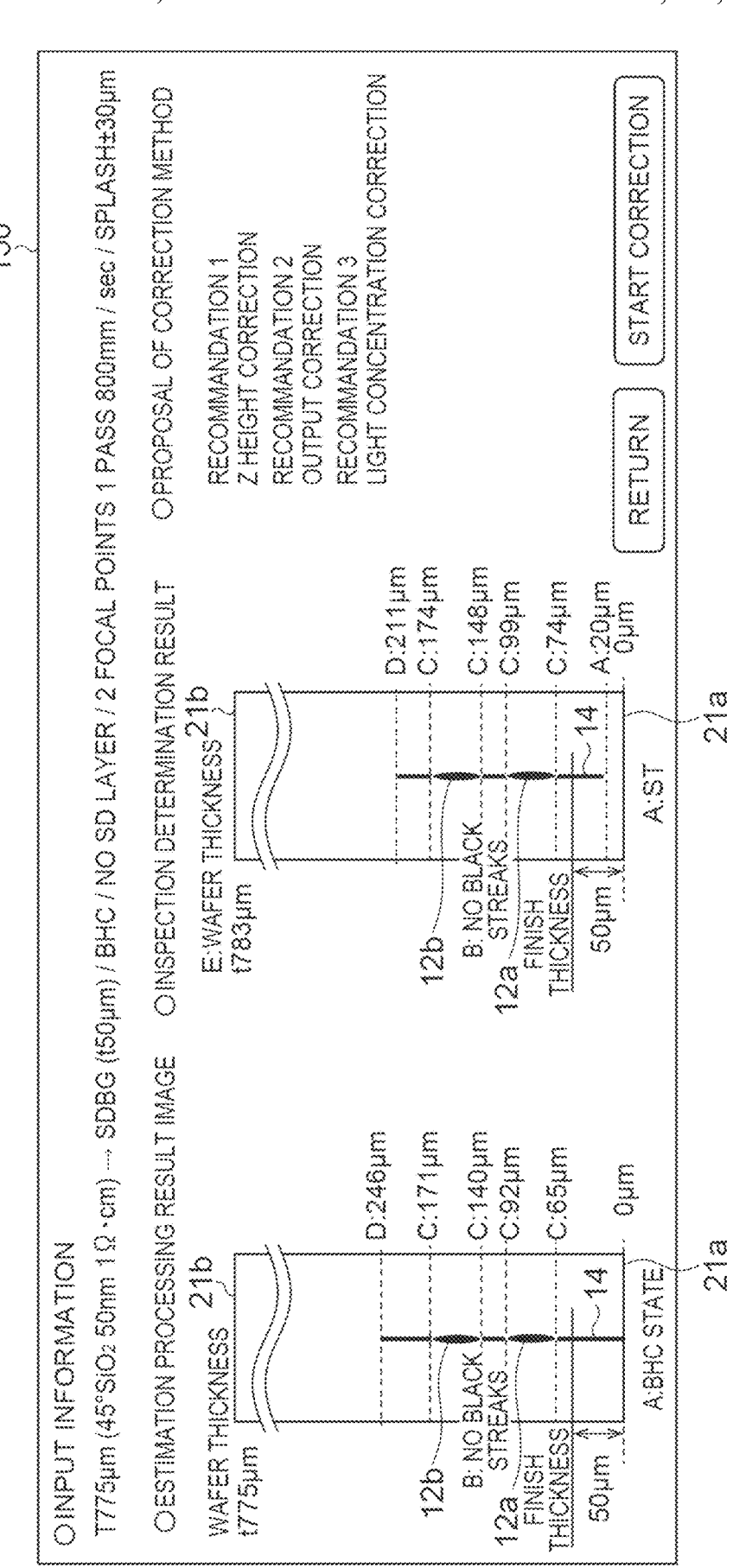

FIG. 24 is an example of a display screen of an inspection determination result (NG).

FIG. 25 is an example of the display screen of the inspection determination result (OK).

Figure 26:
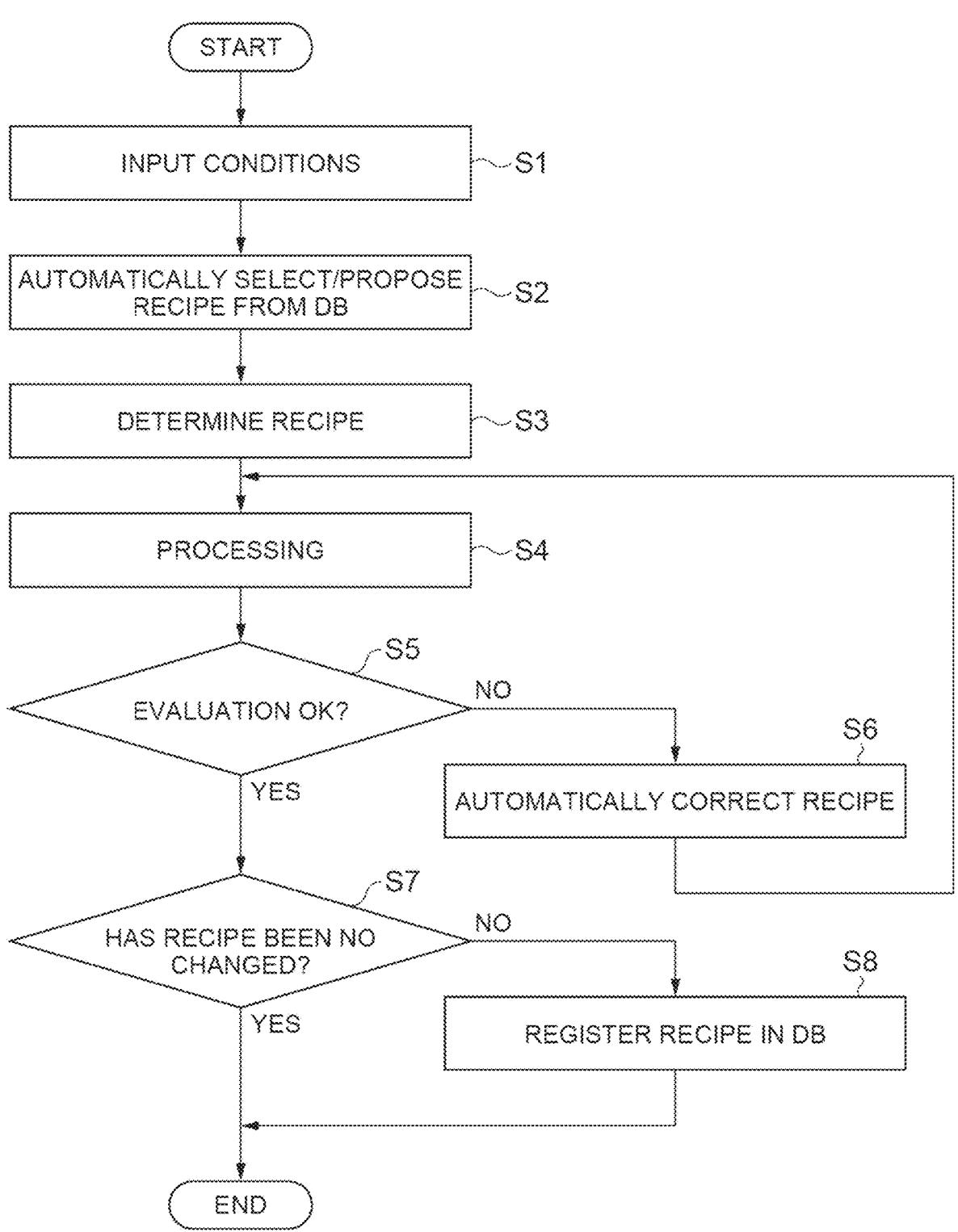

FIG. 26 is a flowchart of an inspection method.

Figure 27:
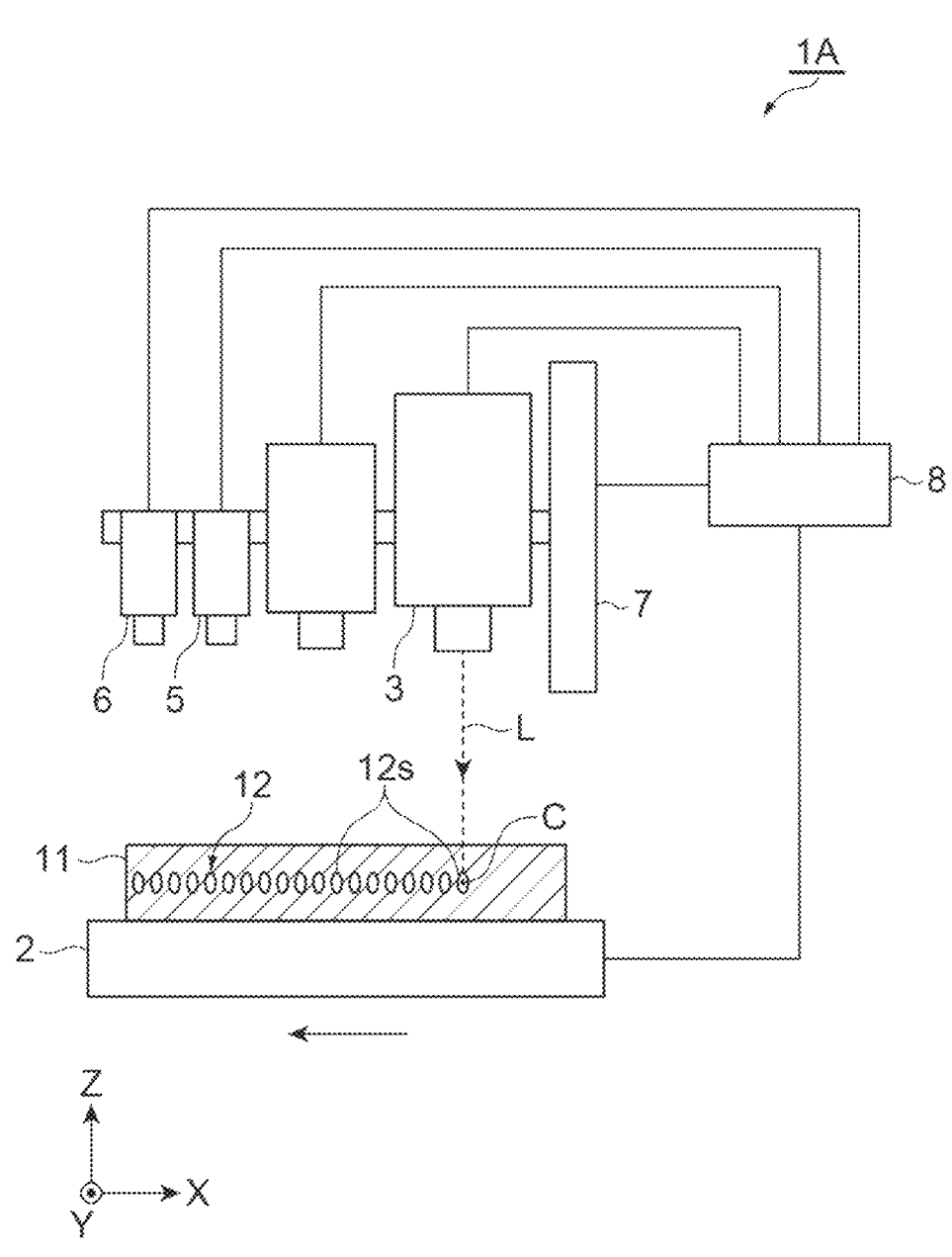

FIG. 27 is a configuration diagram of an inspection device according to a modified example.

Figure 28:
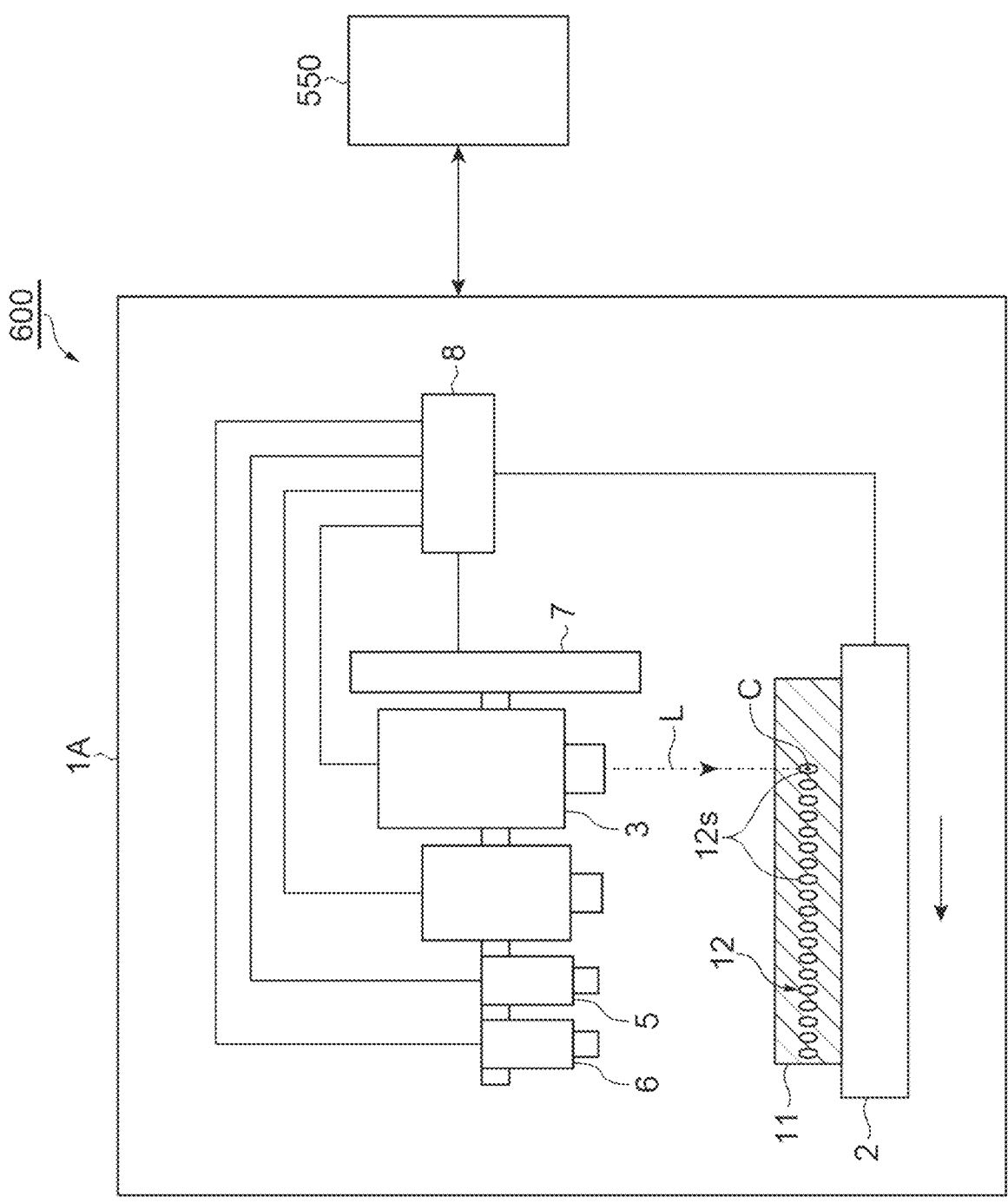

FIG. 28 is a configuration diagram of a processing system according to the modified example.

DESCRIPTION OF EMBODIMENTS

Hereinafter, embodiments of the present invention will be described in detail with reference to the drawings. In each of the drawings, the same or corresponding parts are designated by the same reference numerals, and duplicate description thereof will be omitted.

[Configuration of Inspection Device]

Figure 1:
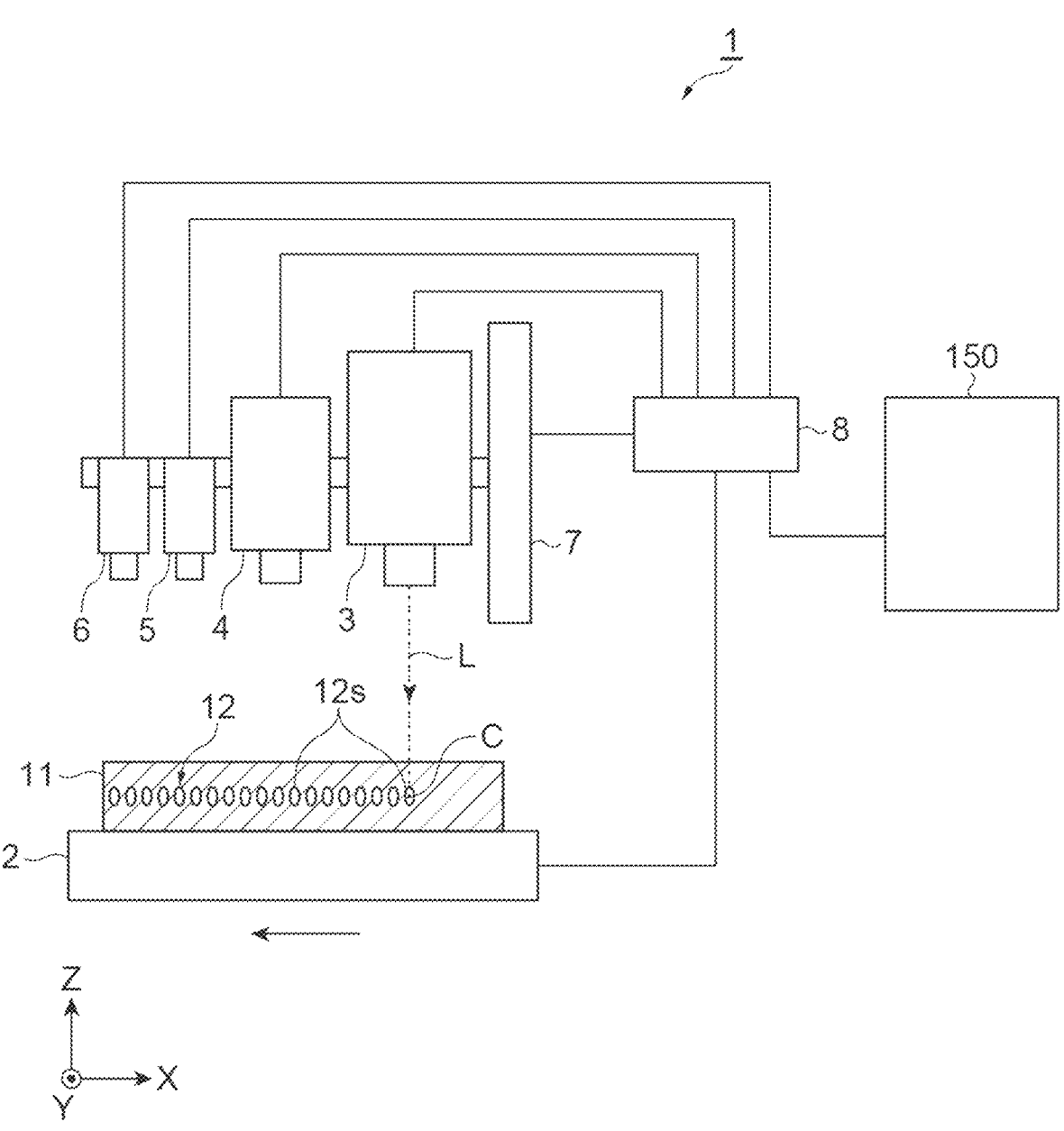
FIG. 1 is a configuration diagram of an inspection device according to an embodiment.

As shown in FIG. 1, an inspection device 1 includes a stage 2, a laser irradiation unit 3 (an irradiation part), a plurality of imaging units 4, 5 and 6, a drive unit 7, a control part 8, and a display 150 (an input part and a display part). The inspection device 1 is a device that forms a modified region 12 in a target object 11 by irradiating the target object 11 with a laser beam L.

The stage 2 supports the target object 11 by, for example, adsorbing a film attached to the target object 11. The stage 2 can move along each of an X direction and a Y direction and can rotate around an axis parallel to a Z direction as a center line. The X and Y directions are a first horizontal direction and a second horizontal direction that are perpendicular to each other, and the Z direction is a vertical direction.

The laser irradiation unit 3 concentrates the laser beam L to which the target object 11 has permeability and irradiates the target object 11. When the laser beam L is concentrated inside the target object 11 supported by the stage 2, the laser beam L is particularly absorbed at a portion corresponding to a condensing point C of the laser beam L, and the modified region 12 is formed inside the target object 11.

The modified region 12 is a region in which density, refractive index, mechanical strength, and other physical properties are different from those of the surrounding non-modified region. The modified region 12 includes, for example, a melt processing region, a crack region, an insulation breakdown region, a refractive index change region, and the like. The modified region 12 has characteristics that a crack easily extends from the modified region 12 to the incident side of the laser beam L and the opposite side thereto. Such characteristics of the modified region 12 are utilized for cutting the target object 11.

As an example, when the stage 2 is moved in the X direction and the condensing point C is moved relative to the target object 11 in the X direction, a plurality of modified spots 12s are formed to be arranged in one row in the X direction. One modified spot 12s is formed by irradiation with one pulse of the laser beam L. The modified region 12 in one row is a set of a plurality of modified spots 12s arranged in one row. Adjacent modified spots 12s may be connected to each other or separated from each other according to a relative moving speed of the condensing point C with respect to the target object 11 and a repetition frequency of the laser beam L.

The imaging unit 4 takes an image of the modified region 12 formed in the target object 11 and a tip end of a crack that extends from the modified region 12.

Under control of the control part 8, the imaging unit 5 and the imaging unit 6 take an image of the target object 11 supported by the stage 2 by light transmitted through the target object 11. The image obtained by the imaging units 5 and 6 is, as an example, used for alignment of an irradiation position of the laser beam L.

The drive unit 7 supports the laser irradiation unit 3 and the plurality of imaging units 4, 5, and 6. The drive unit 7 moves the laser irradiation unit 3 and the plurality of imaging units 4, 5, and 6 in the Z direction.

The control part 8 controls operations of the stage 2, the laser irradiation unit 3, the plurality of imaging units 4, 5, and 6, and the drive unit 7. The control part 8 is configured as a computer device including a processor, a memory, a storage, a communication device, and the like. In the control part 8, the processor executes software (a program) read into the memory or the like, and reading and writing of data in the memory and storage, and communication by the communication device are controlled.

The display 150 has a function as an input part for receiving an input of information from a user and a function as a display part for displaying information to the user.

[Configuration of Target Object]

Figure 2:
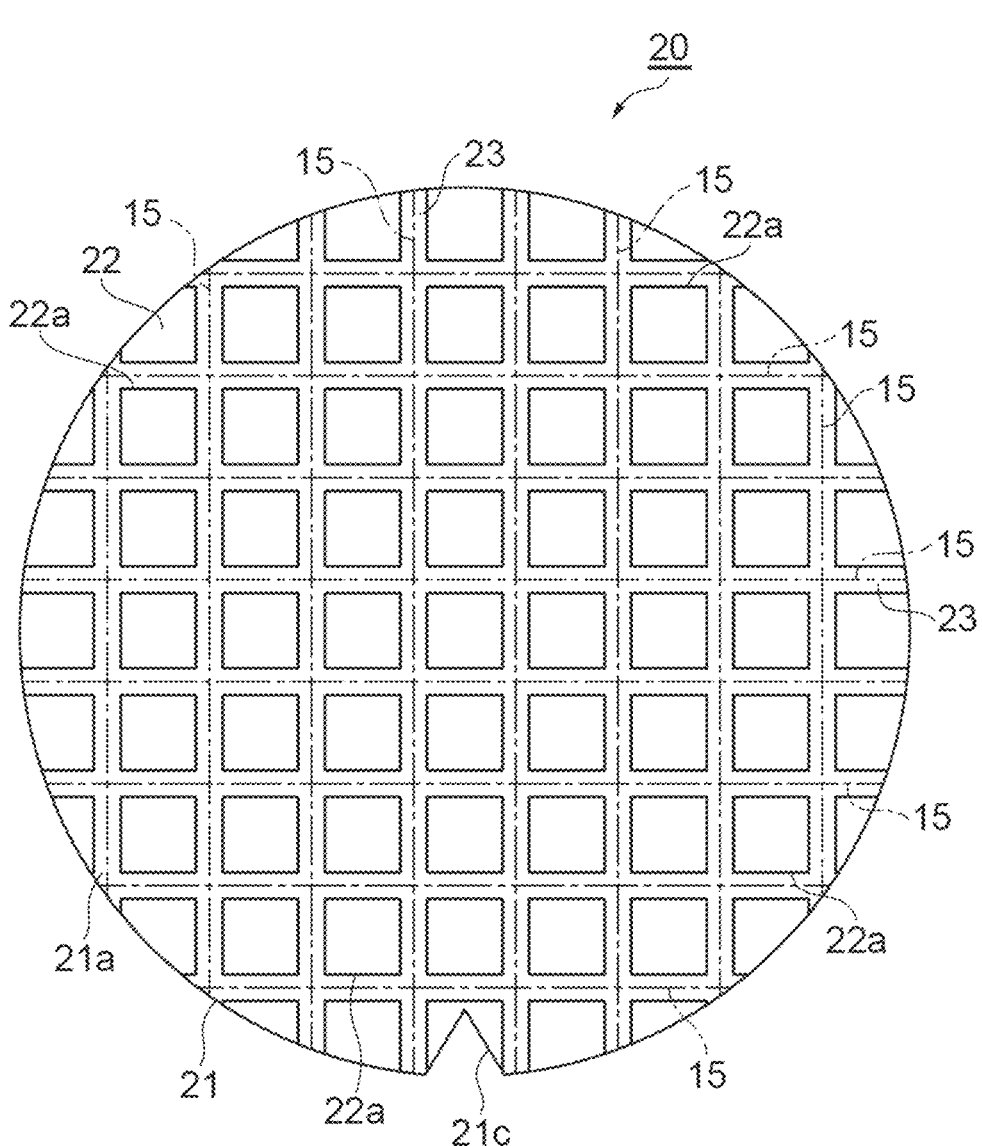
FIG. 2 is a plan view of a wafer according to an embodiment.
Figure 3:
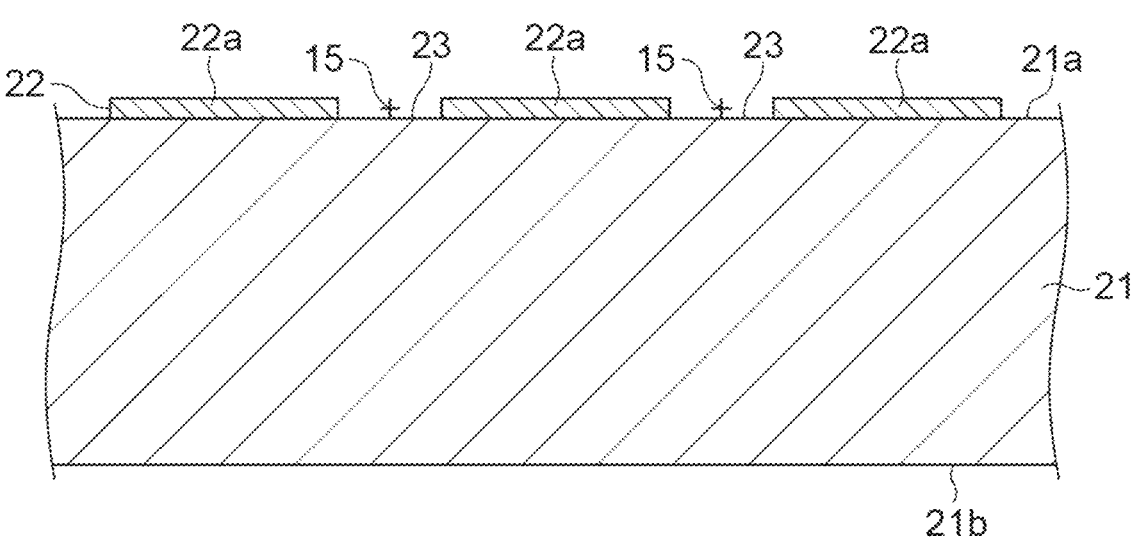
FIG. 3 is a cross-sectional view of a part of the wafer shown in FIG. 2.

The target object 11 of the present embodiment is a wafer 20 as shown in FIGS. 2 and 3. The wafer 20 includes a semiconductor substrate 21 and a functional element layer 22. In the present embodiment, the wafer 20 is described as having the functional element layer 22, but the wafer 20 may or may not have the functional element layer 22 and may be a bare wafer. The semiconductor substrate 21 has a front surface 21a (a second surface) and a back surface 21b (a first surface). The semiconductor substrate 21 is, for example, a silicon substrate. The functional element layer 22 is formed on the front surface 21a of the semiconductor substrate 21. The functional element layer 22 includes a plurality of functional elements 22a arranged two-dimensionally along the front surface 21a. The functional element 22a is, for example, a light receiving element such as a photodiode, a light emitting element such as a laser diode, a circuit element such as a memory, or the like. The functional element 22a may be configured three-dimensionally by stacking a plurality of layers. Although a notch 21c that indicates a crystal orientation is provided in the semiconductor substrate 21, an orientation flat may be provided instead of the notch 21c.

The wafer 20 is cut along each of a plurality of lines 15 for each of the functional elements 22a. The plurality of lines 15 pass between the plurality of functional elements 22a when seen in a thickness direction of the wafer 20. More specifically, the line 15 passes through a center of a street region 23 (a center in a width direction) when seen from the thickness direction of the wafer 20. The street region 23 extends to pass between adjacent functional elements 22a in the functional element layer 22. In the present embodiment, the plurality of functional elements 22a are arranged in a matrix along the front surface 21a, and the plurality of lines 15 are set in a grid pattern. The line 15 is a virtual line here, but may be a line actually drawn.

[Configuration of Laser Irradiation Unit]

Figure 4:
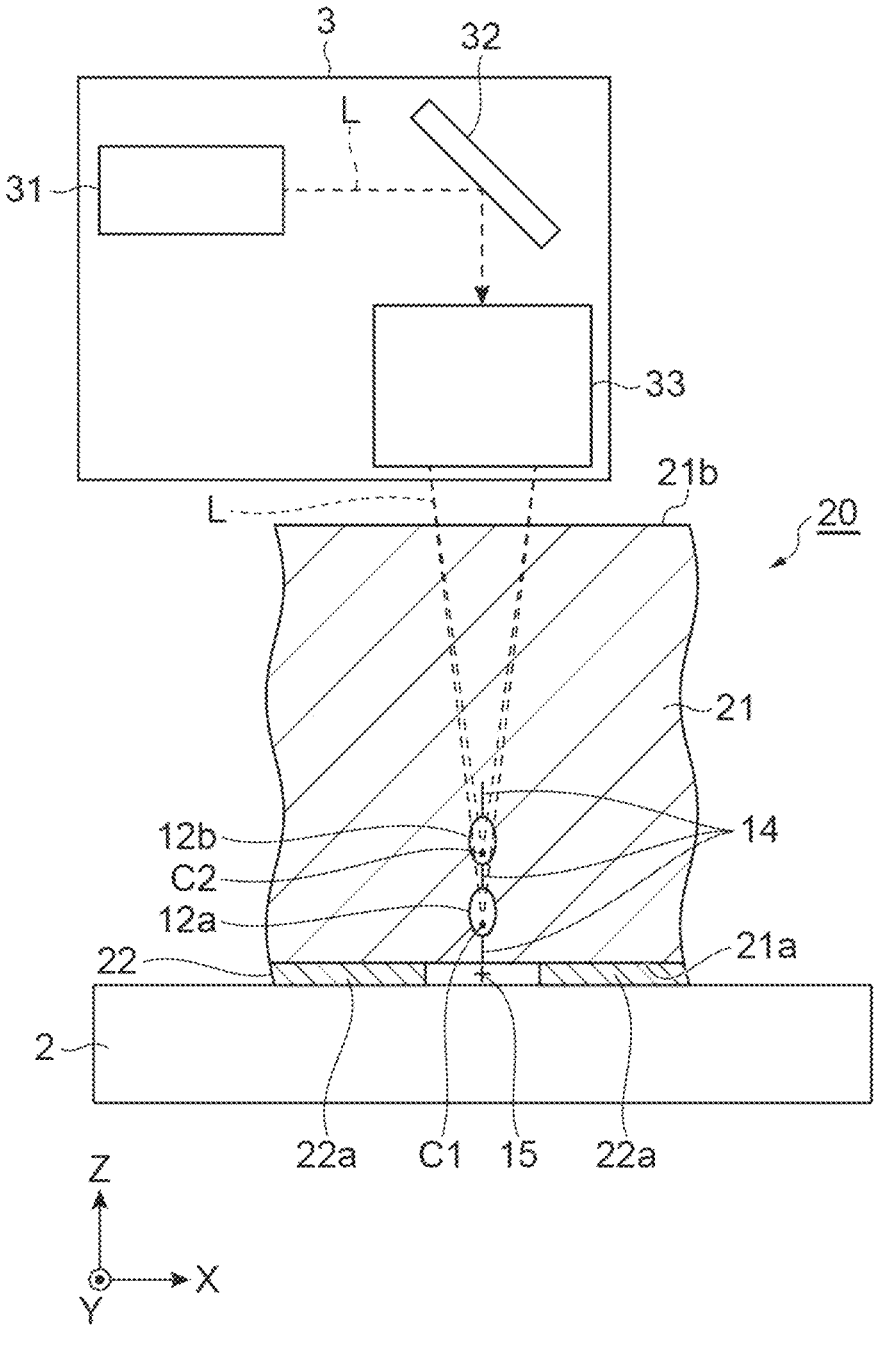
FIG. 4 is a configuration diagram of a laser irradiation unit shown in FIG. 1.

As shown in FIG. 4, the laser irradiation unit 3 includes a light source 31, a spatial light modulator 32, and a condenser lens 33. The light source 31 outputs the laser beam L by, for example, a pulse oscillation method. The spatial light modulator 32 modulates the laser beam L output from the light source 31. The spatial light modulator 32 is, for example, a spatial light modulator (SLM) of a liquid crystal on silicon (LCOS). The condenser lens 33 concentrates the laser beam L modulated by the spatial light modulator 32. The condenser lens 33 may be a correction ring lens.

In the present embodiment, the laser irradiation unit 3 forms two rows of modified regions 12a and 12b inside the semiconductor substrate 21 along each of the plurality of lines 15 by irradiating the wafer 20 with the laser beam L from the back surface 21b side of the semiconductor substrate 21 along each of the plurality of lines 15. The modified region 12a is a modified region closest to the front surface 21a in the two rows of modified regions 12a and 12b. The modified region 12b is a modified region closest to the modified region 12a in the two rows of modified regions 12a and 12b and is a modified region closest to the back surface 21b.

The two rows of modified regions 12a and 12b are adjacent to each other in the thickness direction (the Z direction) of the wafer 20. The two rows of modified regions 12a and 12b are formed by moving two condensing points C1 and C2 relative to the semiconductor substrate 21 along the line 15. The laser beam L is modulated by the spatial light modulator 32 so that, for example, the condensing point C2 is located on the back side in a traveling direction and on the incident side of the laser beam L with respect to the condensing point C1. Regarding formation of the modified region, it may be of single focus or multifocal, and may be of one pass or multiple passes.

The laser irradiation unit 3 irradiates the wafer 20 with the laser beam L from the back surface 21b side of the semiconductor substrate 21 along each of the plurality of lines 15. As an example, for the semiconductor substrate 21 which is a single crystal silicon substrate having a thickness of 775 μm, the two condensing points C1 and C2 are respectively focused at a position of 54 μm and a position of 128 μm from the front surface 21a, and the wafer 20 is irradiated with the laser beam L from the back surface 21b side of the semiconductor substrate 21 along each of the plurality of lines 15. At this time, for example, when a condition is that a crack 14 that extends over the two rows of modified regions 12a and 12b reaches the front surface 21a of the semiconductor substrate 21, a wavelength of the laser beam L is 1099 nm, a pulse width is 700 nsec, and a repetition frequency is 120 kHz. Further, an output of the laser beam L at the condensing point C1 is 2.7 W, an output of the laser beam L at the condensing point C2 is 2.7 W, and a relative moving speed of the two condensing points C1 and C2 with respect to the semiconductor substrate 21 is 800 mm/sec.

The formation of the two rows of modified regions 12*a* and 12*b* and the crack 14 is carried out in the following case. That is, this is a case in which, in a later step, for example, the semiconductor substrate 21 is thinned by grinding the back surface 21*b* of the semiconductor substrate 21, the crack 14 is exposed on the back surface 21*b*, and the wafer 20 is cut into a plurality of semiconductor devices along each of the plurality of lines 15.

[Configuration of Inspection Imaging Unit]

Figure 5:
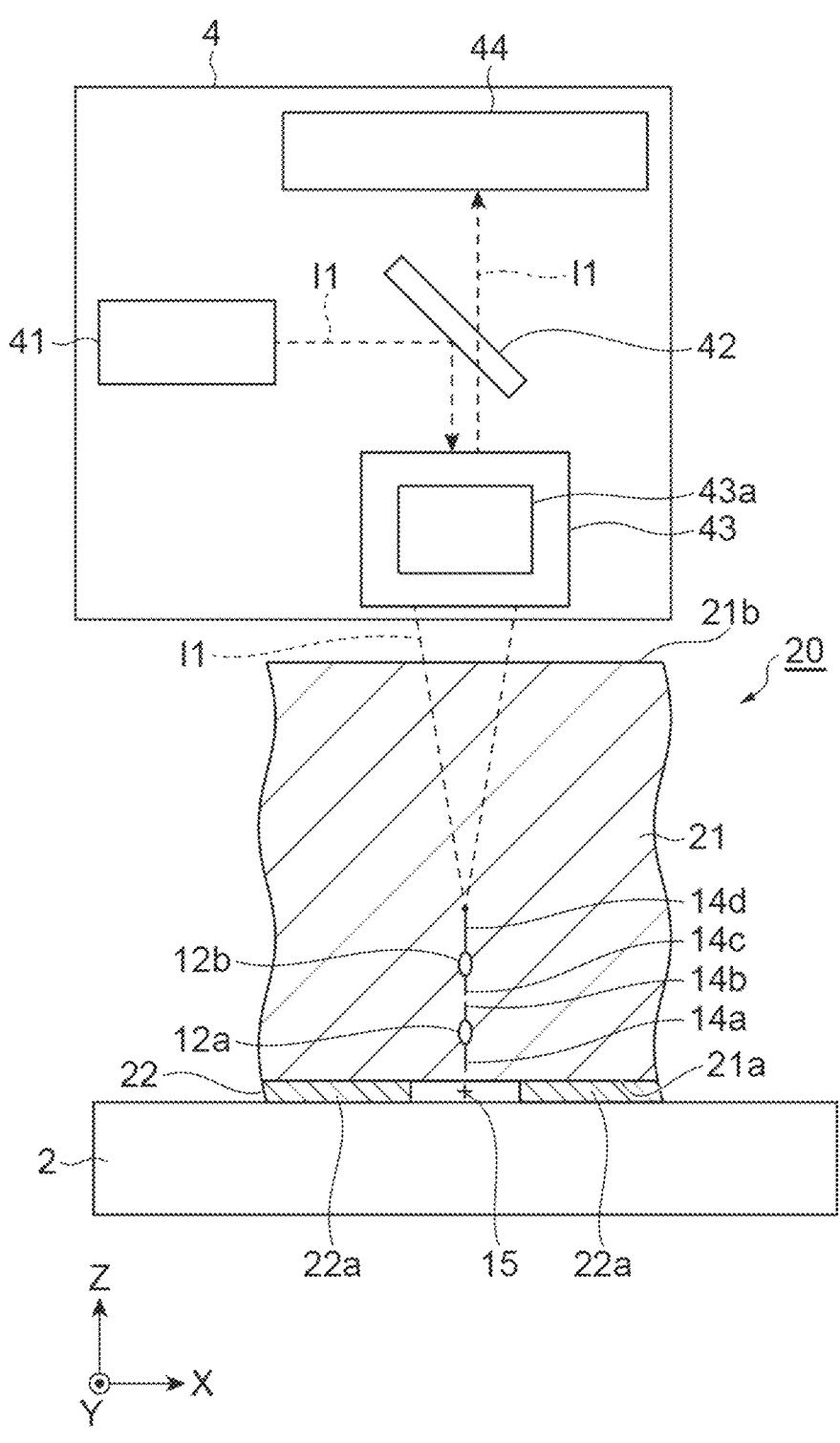
FIG. 5 is a configuration diagram of an inspection imaging unit shown in FIG. 1.

As shown in FIG. 5, the imaging unit (an imaging part) 4 includes a light source 41, a mirror 42, an objective lens 43, and a light detection part 44. The imaging unit 4 takes an image of the wafer 20. The light source 41 outputs light I1 having permeability to the semiconductor substrate 21. The light source 41 is configured of, for example, a halogen lamp and a filter, and outputs the light I1 in a near infrared region. The light I1 output from the light source 41 is reflected by the mirror 42, passes through the objective lens 43, and irradiates the wafer 20 from the back surface 21*b* side of the semiconductor substrate 21. At this time, the stage 2 supports the wafer 20 in which the two rows of modified regions 12*a* and 12*b* are formed as described above.

The objective lens 43 passes the light I1 reflected by the front surface 21*a* of the semiconductor substrate 21. That is, the objective lens 43 passes the light I1 propagating through the semiconductor substrate 21. A numerical aperture (NA) of the objective lens 43 is, for example, 0.45 or more. The objective lens 43 has a correction ring 43*a*. The correction ring 43*a* corrects aberration generated in the light I1 in the semiconductor substrate 21 by adjusting a distance between a plurality of lenses constituting the objective lens 43, for example. A means for correcting the aberration is not limited to the correction ring 43*a* and may be another correction means such as a spatial light modulator. The light detection part 44 detects the light I1 that has passed through the objective lens 43 and the mirror 42. The light detection part 44 is configured of, for example, an InGaAs camera and detects the light I1 in the near infrared region. A means for detecting (imaging) the light I1 in the near infrared region is not limited to the InGaAs camera, and other imaging means may be used as long as it performs transmission type imaging such as a transmission type confocal microscope.

The imaging unit 4 can image the two rows of modified regions 12*a* and 12*b* and tip ends of a plurality of cracks 14*a*, 14*b*, 14*c* and 14*d* (details will be described below). The crack 14*a* is a crack that extends from the modified region 12*a* toward the front surface 21*a*. The crack 14*b* is a crack that extends from the modified region 12*a* to the back surface 21*b* side. The crack 14*c* is a crack that extends from the modified region 12*b* toward the front surface 21*a*. The crack 14*d* is a crack that extends from the modified region 12*b* to the back surface 21*b* side.

[Configuration of Imaging Unit for Alignment Correction]

Figure 6:
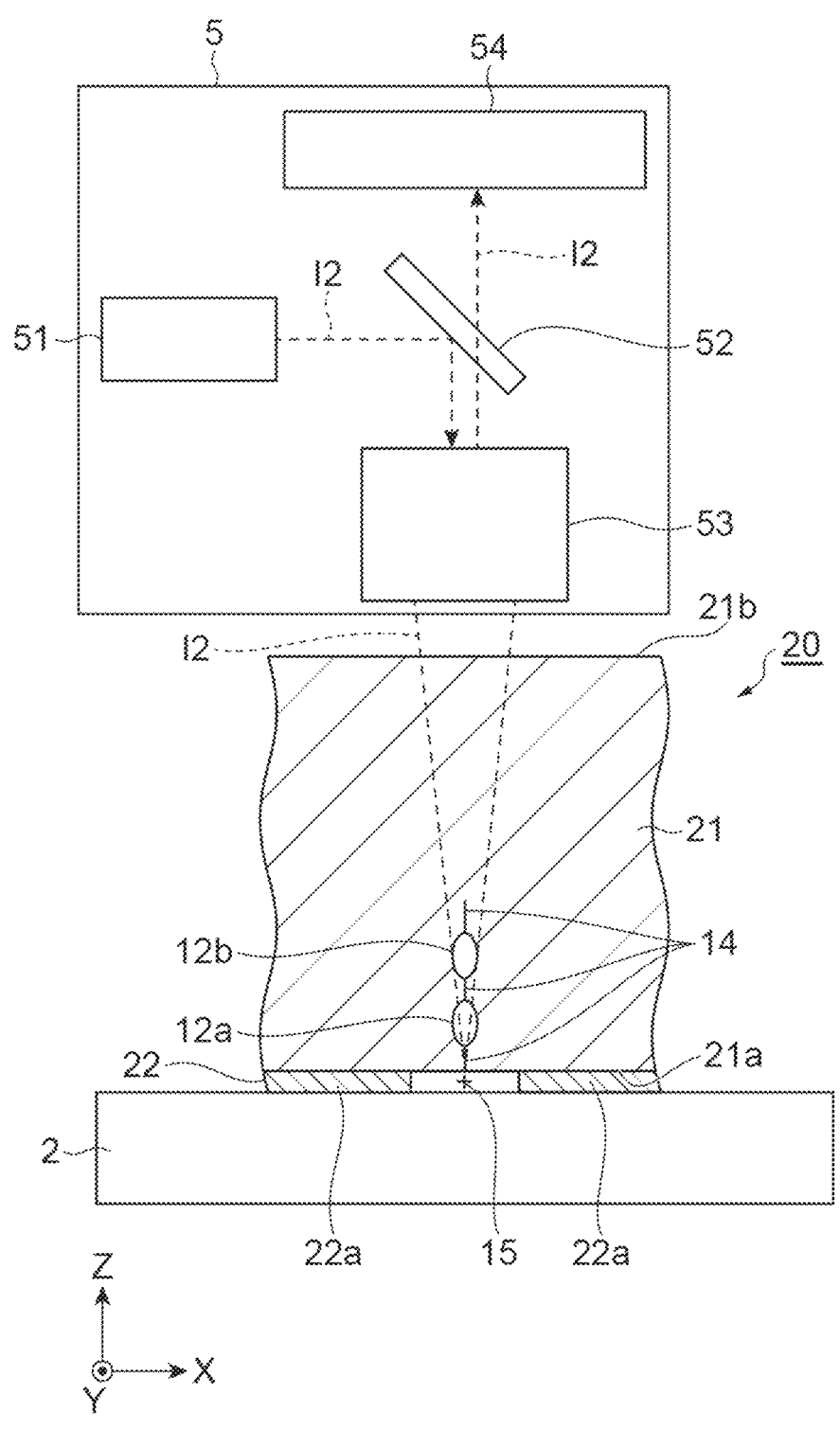
FIG. 6 is a configuration diagram of an imaging unit for alignment correction shown in FIG. 1.

As shown in FIG. 6, the imaging unit 5 includes a light source 51, a mirror 52, a lens 53, and a light detection part 54. The light source 51 outputs light 12 has permeability to the semiconductor substrate 21. The light source 51 is configured of, for example, a halogen lamp and a filter, and outputs the light 12 in a near infrared region. The light source 51 may be shared with the light source 41 of the imaging unit 4. The light 12 output from the light source 51 is reflected by the mirror 52, passes through the lens 53, and irradiates the wafer 20 from the back surface 21*b* side of the semiconductor substrate 21.

The lens 53 passes the light 12 reflected by the front surface 21*a* of the semiconductor substrate 21. That is, the lens 53 passes the light 12 propagating through the semiconductor substrate 21. A numerical aperture of the lens 53 is 0.3 or less. That is, the numerical aperture of the objective lens 43 of the imaging unit 4 is larger than the numerical aperture of the lens 53. The light detection part 54 detects the light 12 that has passed through the lens 53 and the mirror 52. The light detection part 55 is configured of, for example, an InGaAs camera and detects the light 12 in the near infrared region.

Under the control of the control part 8, the imaging unit 5 takes an image of the functional element layer 22 by irradiating the wafer 20 with the light 12 from the back surface 21*b* side and detecting the light 12 returning from the front surface 21*a* (the functional element layer 22). Further, similarly, under the control of the control part 8, the imaging unit 5 acquires an image of a region including the modified regions 12*a* and 12*b* by irradiating the wafer 20 with the light 12 from the back surface 21*b* side and detecting the light 12 returning from formation positions of the modified regions 12*a* and 12*b* in the semiconductor substrate 21. The images are used for alignment of an irradiation position of the laser beam L. The imaging unit 6 has the same configuration as the imaging unit 5 except that the lens 53 has a lower magnification (for example, 6 times in the imaging unit 5 and 1.5 times in the imaging unit 6) than the lens 53, and is used for alignment as in the imaging unit 5.

[Imaging Principle of Inspection Imaging Unit]

Figure 7:
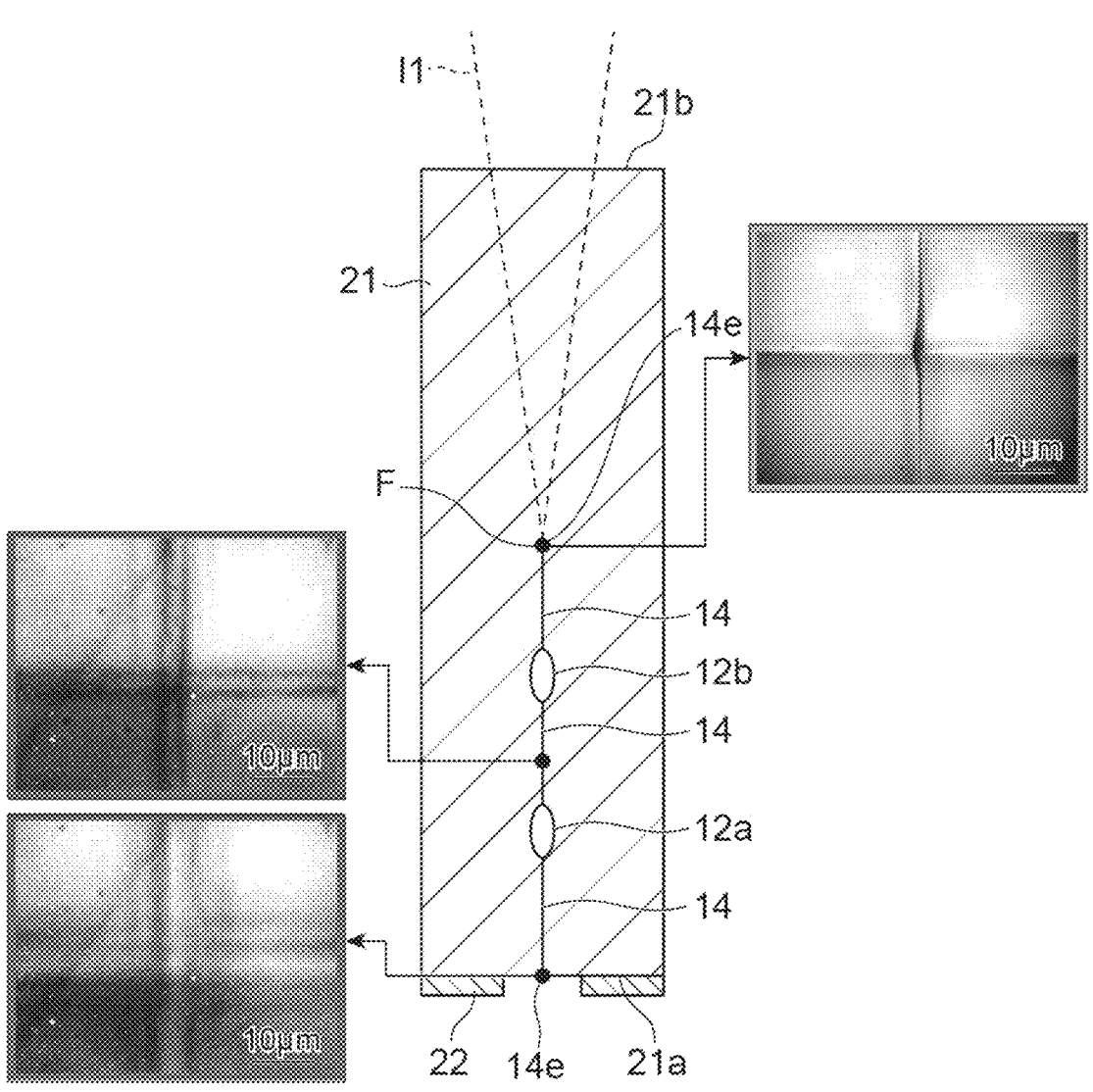
FIG. 7 is a cross-sectional view of a wafer for describing an imaging principle of the inspection imaging unit shown in FIG. 5 and images at each location by the inspection imaging unit.

As shown in FIG. 7, a focal point F (a focal point of the objective lens 43) is moved from the back surface 21*b* side to the front surface 21*a* side with respect to the semiconductor substrate 21, in which the crack 14 that extends over the two rows of modified regions 12*a* and 12*b* reaches the front surface 21*a*, using the imaging unit 4 shown in FIG. 5. In this case, when the focal point F is focused on an tip end 14*e* of the crack 14, which extends from the modified region 12*b* to the back surface 21*b* side, from the back surface 21*b* side, the tip end 14*e* can be confirmed (an image on the right side in FIG. 7). However, even when the focal point F is focused on the crack 14 itself and the tip end 14*e* of the crack 14 reaching the front surface 21*a* from the back surface 21*b* side, the crack 14 and the tip end 14*e* of the crack 14 cannot be confirmed (an image on the left side in FIG. 7). When the focal point F is focused on the front surface 21*a* of the semiconductor substrate 21 from the back surface 21*b* side, the functional element layer 22 can be confirmed.

Figure 8:
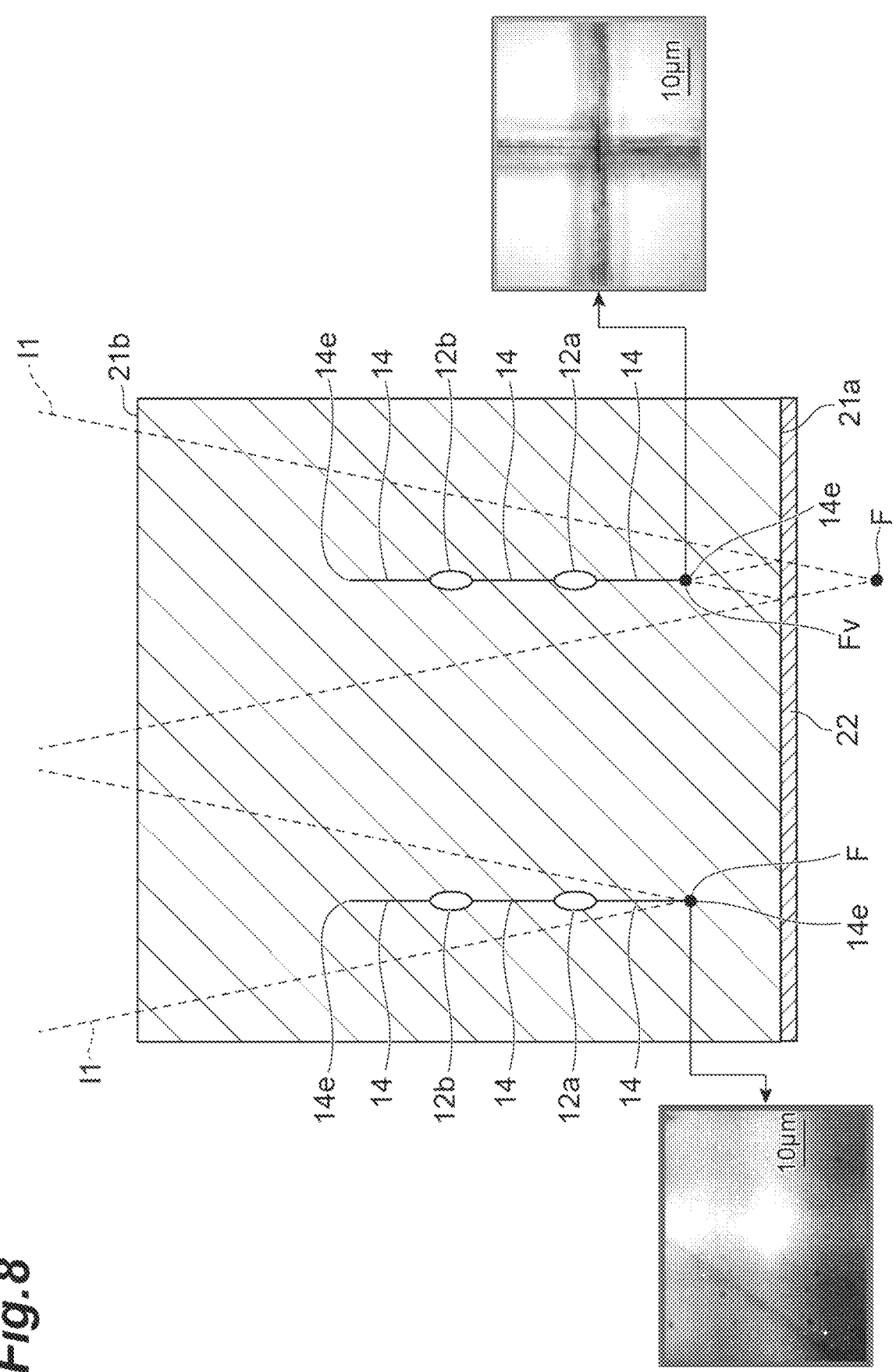
FIG. 8 is a cross-sectional view of the wafer for describing the imaging principle of the inspection imaging unit shown in FIG. 5 and images at each location by the inspection imaging unit.

As shown in FIG. 8, the focal point F is moved from the back surface 21*b* side to the front surface 21*a* side with respect to the semiconductor substrate 21, in which the cracks 14 that extends over the two rows of modified regions 12*a* and 12*b* do not reach the front surface 21*a*, using the imaging unit 4 shown in FIG. 5. In this case, even when the focal point F is focused from the back surface 21*b* side to the tip end 14*e* of the crack 14 that extends from the modified region 12*a* to the front surface 21*a* side, the tip end 14*e* cannot be confirmed (an image on the left side in FIG. 8). However, when the focal point F is focused from the back surface 21*b* side to a region opposite to the back surface 21*b* (that is, a region on the functional element layer 22 side with respect to the front surface 21*a*) with respect to the front surface 21*a* and a virtual focal point Fv symmetrical to the focal point F with respect to the front surface 21*a* is located at the tip end 14*e*, the tip end 14*e* can be confirmed (an image on the right side in FIG. 8). The virtual focal point Fv is a point symmetrical with respect to the focal point F in consideration of a refractive index of the semiconductor substrate 21, and the front surface 21*a*.

Figure 10:
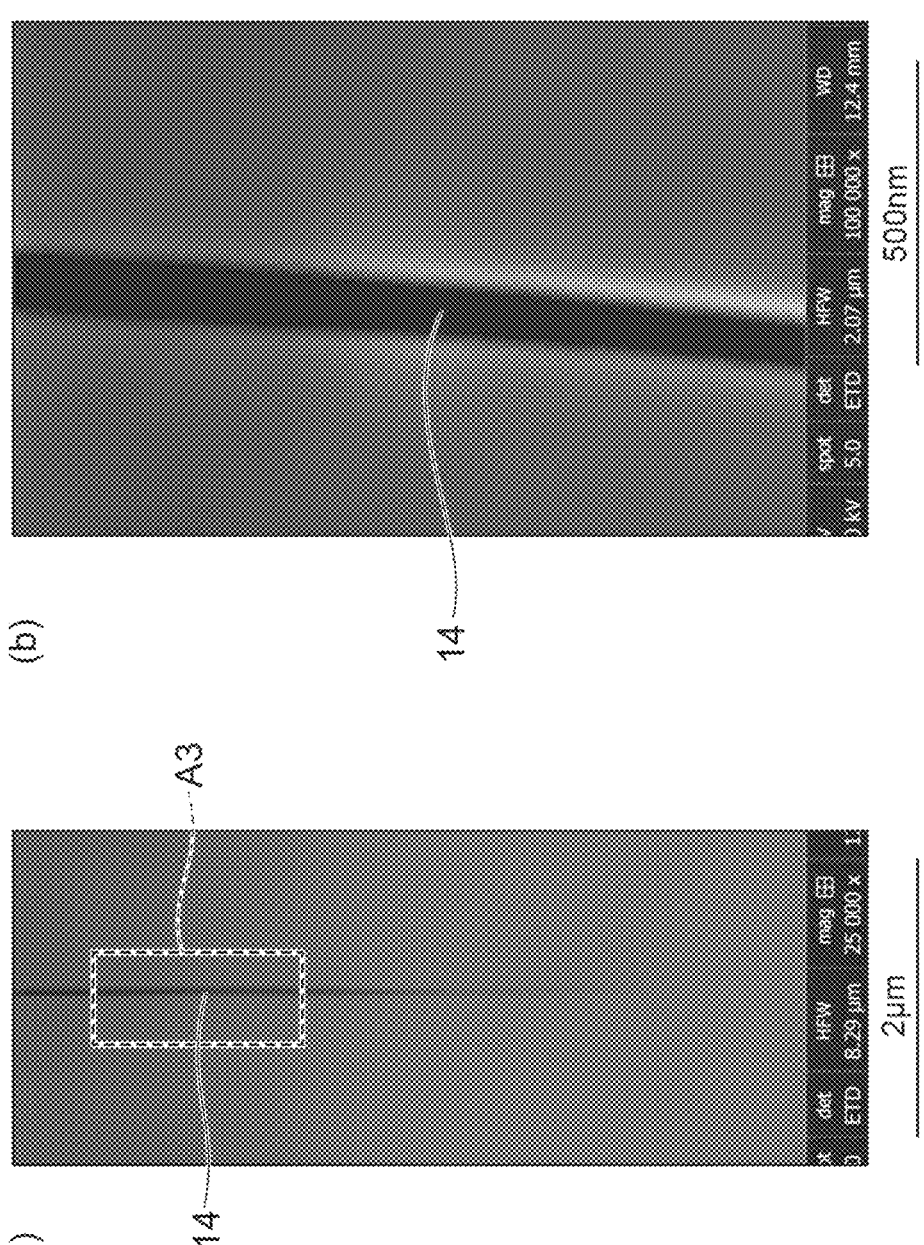
FIG. 10 is an SEM image of the modified region and the crack formed inside the semiconductor substrate.

It is presumed that the reason why the crack 14 itself cannot be confirmed as described above is that a width of the crack 14 is smaller than a wavelength of the light I1 which is illumination light. FIGS. 9 and 10 are scanning electron microscope (SEM) images of the modified region 12 and the crack 14 formed inside the semiconductor substrate 21 which is a silicon substrate. FIG. 9(*b*) is an enlarged image of a region A1 shown in FIG. 9(*a*), FIG. 10(*a*) is an enlarged image of a region A2 shown in FIG. 9(*b*), and FIG. 10(*b*) is an enlarged image of a region A3 shown in FIG. 10(*a*). As described above, the width of the crack 14 is about 120 nm, which is smaller than the wavelength (for example, 1.1 to 1.2 µm) of the light I1 in the near infrared region.

The imaging principle assumed based on the above is as follows. As shown in FIG. 11(*a*), when the focal point F is located in the air, the light I1 is not returned, and thus a blackish image is obtained (an image on the right side in FIG. 11(*a*)). As shown in FIG. 11(*b*), when the focal point F is located inside the semiconductor substrate 21, the light I1 reflected by the front surface 21*a* is returned, and thus a whitish image is obtained (an image on the right side in FIG. 11(*b*)). As shown in FIG. 11(*c*), when the focal point F is focused on the modified region 12 from the back surface 21*b* side, since absorption, scattering, or the like of some of the light I1 reflected and returned by the front surface 21*a* occurs due to the modified region 12, an image in which the modified region 12 appears blackish in a whitish background can be obtained (an image on the right side in FIG. 11(*c*)).

As shown in FIGS. 12(*a*) and 12(*b*), when the focal point F is focused on the tip end 14*e* of the crack 14 from the back surface 21*b* side, for example, since scattering, reflection, interference, absorption, or the like occurs for some of the light I1 reflected and returned from the front surface 21*a* due to optical specificity (stress concentration, strain, discontinuity of atomic density, and the like) generated near the tip end 14*e*, light confinement generated near the tip end 14*e*, and the like, an image in which the tip end 14*e* appears blackish in a whitish background can be obtained (an image on the right side in FIGS. 12(*a*) and 12(*b*)). As shown in FIG. 12(*c*), when the focal point F is focused on a portion other than the vicinity of the tip end 14*e* of the crack 14 from the back surface 21*b* side, since at least some of the light I1 reflected by the front surface 21*a* is returned, a whitish image is obtained (an image on the right side in FIG. 12(*c*)).

[Processing Condition Derivation Process]

Hereinafter, a processing condition derivation process which is performed as a pretreatment for a process of forming the modified region for the purpose of cutting the wafer 20 will be described. The processing conditions are a recipe related to processing that indicates conditions and procedures for processing the wafer 20. The control part 8 is configured to determine the processing conditions including irradiation conditions of a laser beam by the laser irradiation unit 3 based on information received by the display 150 (a processing condition determination process), to control the laser irradiation unit 3 so that the wafer 20 is irradiated with the laser beam under the determined processing conditions (a processing process), to acquire a laser processing result of the wafer 20 due to the irradiation of the laser beam by controlling the imaging unit 4 to take an image of the wafer 20 (a processing result acquisition process), and to evaluate the processing conditions based on the laser processing result (a processing condition evaluation process).

(Processing Condition Determination Process)

The processing condition determination process will be described with reference to FIGS. 13 to 21. In the processing condition determination process, first, the display 150 receives a user input of wafer processing information including information on the wafer 20 and a laser processing target for the wafer 20. The laser processing target is information that indicates the content of laser processing desired by the user. FIGS. 13 to 15 are examples of a setting screen (a user input reception screen) of the wafer processing information displayed on the display 150. FIG. 13 is a setting screen for a processing method (information included in the above-described laser processing target), FIG. 14 is a setting screen for wafer information (information included in the above-described information on wafer 20), and FIG. 15 is a setting screen for processing settings (information included in the above-described laser processing target). Here, the processing method (FIG. 13), the wafer information (FIG. 14), and the processing settings (FIG. 15) will be described as being set in this order, but the setting order (the screen display order) is not limited thereto.

As shown in FIG. 13, the display 150 first receives the user input of the processing method. As the processing method, for example, there are largely stealth dicing after grinding (SDAG) and stealth dicing before grinding (SDBG). The SDAG is a processing method in which stealth dicing is performed after grinding the wafer 20. The SDBG is a processing method in which stealth dicing is performed before grinding the wafer 20. In detail, the SDAG is divided into three types, for example, SDAG (front surface incidence), SDAG (back surface incidence), and SDAG (processing through Tape). The SDAG (front surface incidence) is a processing method that radiates a laser from the front surface 21*a* side after grinding the wafer 20, and is a processing method used when there is no TEG on an incident surface such as MEMS and a street width can be ensured. The SDAG (back surface incidence) is a processing method used when there is TEG on the front surface 21*a* or when it is desired to reduce the street width. The SDAG (processing through Tape) is used when it is desired to reduce a tape transfer step. In detail, the SDBG is divided into two types, for example, SDBG (front surface incidence) and SDBG (back surface incidence). In the following, an example in which the SDBG (back surface incidence) is set as the processing method will be described.

As shown in FIG. 14, the display 150 subsequently receives the user input of the wafer information. As the wafer information, for example, a wafer thickness, a finish thickness, a wafer type, a state of an incident surface, a resistance value (a doping amount), an Index size (ch1), and an Index size (ch2) can be set. Among them, for example, the setting of the wafer thickness and the finish thickness may be necessary. The wafer thickness is information that indicates a thickness of the wafer 20. The wafer thickness is, for example, a thickness including both the semiconductor substrate 21 (silicon) and the functional element layer 22 (pattern) of the wafer 20. The wafer thickness may be set separately for a silicon wafer thickness and a pattern thickness. The finish thickness is, for example, information that indicates the thickness of the wafer 20 after grinding. That is, grinding is performed by a grinder until the finish thickness is reached. After the grinding is performed by the grinder, a tape transfer step and an expanding step are carried out. When a stealth dicing device and a grinding device (the grinder) can communicate with each other, information on the finish thickness may be shared between the two devices. The finish thickness is, for example, a thickness including both the semiconductor substrate 21 (silicon) and the functional element layer 22 (pattern) of the wafer 20. The finish thickness may be set separately for a silicon wafer thickness and a pattern thickness. Pattern thickness information, laminated structure information, and the like are used, for example, when the control part 8 estimates a length of the crack 14. A grinding amount may be set instead of the finish thickness.

The wafer type is, for example, a type such as a "0°" product or a "45°" product according to a position of the notch. For example, when 45° is set as the wafer type, bottom side half-cut (BHC) is recommended in a BHC state of processing setting which will be described below. The "BHC" is a term indicating a state in which the crack 14 reaches the front surface 21*a* (that is, a crack reaching state). In order to be BHC, it is sufficient that the crack 14 reaches the front surface 21*a*, and it does not matter whether or not the crack 14 reaches a pattern surface (a surface of the functional element layer 22). When 0° is set as the wafer type, both stealth (ST) and BHC are recommended in the BHC state of the processing setting which will be described below. The "ST" is a term indicating a state in which the crack 14 does not reach the back surface 21*b* and the front surface 21*a*. A state of the incident surface is information that indicates a film type (a refractive index), a film thickness, and the like of the incident surface. A reflectance is calculated by the control part 8 based on the state of the incident surface, the laser wavelength, and the like, and the output of the laser beam is determined. The resistance value (the doping amount) is a value of resistance (in the case of the doping amount, a value obtained by converting the doping amount into the resistance value). An arrival rate is calculated by the control part 8 based on the resistance value, the laser wavelength, and the like, and the output of the laser beam is determined. The Index size is information used for determining an index value of a dicer and the like. When an unknown wafer 20 is processed, the wafer type, the state of the incident surface, the resistance value, and the like are unknown and may not be set.

As shown in FIG. 15, the display 150 subsequently receives the user input for the processing setting. In addition, some of a variety of information of the processing setting may be automatically set based on the above-described processing method and wafer information. As the processing setting, for example, a BHC state (crack arrival information), a Si remaining amount (information that indicates an assumed extension amount of the crack), the number of passes, a speed, a finish cross section, and a splash range can be set. Among them, for example, the setting of the BHC state may be necessary. The BHC state is information that indicates either the BHC or the ST. That is, the BHC state is crack arrival information that indicates whether the crack that extends from the modified region formed when the wafer 20 is irradiated with the laser beam reaches or does not reach the front surface 21*a* of the wafer 20. When the ST is set in the BHC state, the Si remaining amount described above can be set. The Si remaining amount is a length from an arrival position of the crack 14 after the ST processing to the front surface 21*a* (a length of a silicon portion remaining after the ST processing). When the ST processing is performed, in order to finally divide the wafer 20, it is necessary to extend the crack 14 at the time of grinding to bring the crack 14 into the BHC state before the expanding process. It is common for the user to grasp how much the crack 14 extends by grinding and to operate it. For example, it is conceivable to grasp an extension amount of the crack 14 in the grinder by the number of stages of a Z height that indicates a processing depth (a height) when the laser processing is performed. That is, it is conceivable that the user grasps the assumed extension amount of the crack 14 in the grinder by the number of stages of the Z height, for example, "by Z1" (by a depth of one stage of Z height) and "by Z2" (by a depth of two stages of the Z height).

Therefore, at the time of ST processing, it is possible to reliably divide the wafer 20, while the ST processing is performed and an advantage of the ST processing (an increase in a processing speed or a reduction in the splash) is taken, by setting the assumed extension amount (the number of stages of the Z height) of the crack 14 in the grinder as the Si remaining amount. When the Z height is set during the laser processing, it is shifted from a position at which the BHC is reached by the Z height set by the amount of Si remaining in an ST direction (a direction in which the crack 14 becomes shorter). In a database which will be described below (a database in which the wafer processing information and the processing conditions (the recipe) are stored in association with each other), a recipe including the Si remaining amount may be stored. The Si remaining amount may be calculated from the wafer thickness and the Z height by measuring a crack amount in the ST state, for example.

The number of passes is information that indicates the number of passes and the number of focal points. The number of passes is set to a value desired by the user. In a case in which the processing is not possible with the set number of passes, the control part 8 may increase the number of passes when the processing conditions (the recipe) are proposed to the user or when the processing conditions (the recipe) are corrected. When the variety of wafer processing information received through the display 150 is not appropriate, the control part 8 may control the display 150 so that a message that prompts correction is displayed. The speed is a laser processing speed. The control part 8 determines a laser output, a frequency, and a pulse pitch in consideration of the set speed. When the processing is not possible at the set speed, the control part 8 may change the speed when the processing conditions (the recipe) are proposed to the user or when the processing conditions (the recipe) are corrected. The splash range is information that indicates a width of the splash. When the splash range is narrow, the control part 8 may determine the Z height or pulse pitch in the ST state, or may determine the processing conditions in which a black streak is generated.

The finish cross section is information that indicates whether or not the modified region (a stealth dicing (SD) layer) formed when the wafer 20 is irradiated with the laser beam appears on a chip cross section (a finish cross section of the wafer 20) after a laser processing and a finishing (grinding) processing are completed. In the SDBG, since the grinding is performed after the laser processing, it is possible to finish without leaving the SD layer on the chip cross section according to the conditions. Since the SD layer does not remain on the chip cross section, strength of the chip can be improved, and particles can be reduced. Conditions under which "no SD layer" can be set for the finish cross section will be described with reference to FIG. 16. In FIGS. 16(*a*) to 16(*d*), SD1 indicates the modified region. Now, it is assumed that "no SD layer" is set for the finish cross section of the display 150 in the processing setting. In this case, as shown in FIG. 16(*a*), the control part 8 determines the processing conditions so that the SD1 is set so that a length from a lower end of the SD1 to the front surface 21*a* (a distance of the lower end of the SD1) is longer than the finish thickness set in the wafer information. Now, when a crack length is longer than the distance of the lower end of the SD1 in the BHC state as shown in the left drawing of FIG. 16(*b*), or when the total of the crack length and the Si remaining amount is longer than the distance of the lower end of the SD1 in the ST state as shown in the right drawing of FIG. 16(*b*), the control part 8 determines that "no SD layer" can be set for the finish cross section. On the other hand, as shown in FIG. 16(c), for example, in the ST state, when the total of the crack length and the Si remaining amount is shorter than the distance of the lower end of the SD1, the control part 8 determines that "no SD layer" cannot be set for the finish cross section. In this case, the control part 8 may switch the finish cross section to "with SD layer". Alternatively, the finish cross section may be switched to "with SD layer" at the discretion of the user.

As shown in FIG. 15, on a processing setting input screen, it is possible to select whether or not two items of "display/ confirm a recipe before processing" and "confirm processing result before recipe correction" are implemented. The recipe is information that indicates the processing conditions. When "display/confirm a recipe before processing" is selected, and the recipe (the processing conditions) is determined by the control part 8, the recipe is displayed before the laser processing. When "display/confirm a recipe before processing" is not selected, and the recipe (the processing conditions) is determined by the control part 8, the laser processing is started without displaying the recipe. When "confirm processing result before recipe correction" is selected, the actual processing result is displayed before recipe correction (or recipe confirm). When "confirm processing result before recipe correction" is not selected, and the processing is completed, the recipe correction (or the recipe confirm) is performed without displaying the actual processing result. When the "recipe creation" shown in FIG. 15 is pressed, a recipe determination process by the control part 8 is performed.

The control part 8 determines the recipe (the processing conditions) including the irradiation conditions of the laser beam by the laser irradiation unit 3 based on the wafer processing information received through the display 150 (a variety of information received on the setting screens of FIGS. 13 to 15). The control part 8 determines the recipe (the processing conditions) corresponding to the wafer processing information received through the display 150 by referring to the database in which the wafer processing information and the recipe (the processing conditions) are stored in association with each other. More specifically, the control part 8 may determine the recipe corresponding to the wafer processing information received through the display 150 by a computer program based on an algorithm generated from the database or a feedback control program that refers to the database. The database may be included in the inspection device 1 or may be included in an external device (a Web server) capable of communicating with the inspection device 1. For example, according to an installation location of the inspection device 1, the inspection device 1 may not be able to connect to a network. Even in such a case, in the inspection device 1, the control part 8 can perform a function related to the database by installing a database such as a native application by an electronic medium (DVD, CD, USB memory, SD card, and the like). In such a configuration, although it is not possible to connect to the database that is centrally managed on the Web server, it is possible to collect feedback information only for a specific user, to continuously update the database, and to improve accuracy of an inspection in a focused and continuous manner by individually managing the database in the inspection device 1. In addition, when the database is present on the Web server, it becomes easier to centrally manage the database, and it becomes possible to widely provide an inspection function that utilizes the database (a user DB) by publishing Web applications and Web APIs and distributing native applications. Additionally, the accuracy of the inspection can be comprehensively and continuously improved by collecting feedback information from a large number of users and continuously updating the database. FIG. 17 is a diagram showing recipe selection from the database. FIG. 17 is a schematic diagram for describing the determination of the processing conditions (the recipe) using the database and does not show information actually stored in the database. For example, in FIG. 17, an estimation processing result image (which will be described below) related to each recipe is shown, but the image may not actually be stored in the database. The recipe includes the wavelength, pulse width, frequency, and speed of the laser beam which are the irradiation conditions (the laser conditions) of the laser beam, and the number of focal points which is information related to the processing point setting/LBA setting, correction levels for spherical aberration and astigmatism related to a condensing state of the processing point, the Z height when a modified region is formed, and the like.

As shown in FIG. 17, the recipe (the processing conditions) corresponding to each wafer processing information is stored in the database. The control part 8 performs matching with the wafer processing information (input information) received by the display 150, and selects a recipe corresponding to the wafer processing information closest to the input information in the wafer processing information stored in the database as a proposed recipe. The matching process may be performed using artificial intelligence (AI). Now, as shown in FIG. 17, it is assumed that "wafer thickness: 775 μm," "finish thickness: 50 μm," "wafer type: 45°," "state of incident surface: $SiO_2$ film of 50 nm," "resistance value (doping amount): 1 Ω·cm," "processing method: SDBG (back surface)," "BHC state: BHC," "the number of passes: 2 focal points 1 pass," "speed: 800 mm/sec," "finish cross section: no SD layer," and "splash range: splash±30 μm" are input as input information. In this case, the control part 8 refers to the database and selects a recipe (a leftmost recipe) in which "wafer thickness t 775 μm," "finish thickness ~60 μm," "BHC condition," "2 focal point 1 pass," "800 mm/sec," "no SD layer," and "splash±10" are set as the wafer processing information as the proposed recipe.

When there is a deviation (there is a parameter that is deviated) between the wafer processing information of the proposed recipe selected by performing the above-described matching process and the wafer processing information of the input information, the control part 8 may correct the deviation of parameters by calculation and simulation and may determine the recipe in which the parameters are corrected as the proposed recipe. For example, the control part 8 may correct the Z height according to a difference in the wafer thickness when the wafer thicknesses are different from each other, may correct the output of the laser beam according to a difference in the resistance value when the resistance values are different from each other, may correct the frequency of the laser beam according to a difference in speed when the speed is different, and may correct the number of focal points according to a difference in the number of passes when the number of passes is different.

By referring to the database, the control part 8 may extract a plurality of recipe candidates that are candidates for the processing conditions (the recipe) corresponding to the wafer processing information that has received the input and may control the display 150 so that the plurality of recipe candidates are displayed. In an example shown in FIG. 18, the control part 8 extracts three recipe candidates. Now, the input information is the same as the example of FIG. 17 described above. Additionally, a most recommended recipe (the recipe described as "Proposal 1 Recommended" in FIG.

18), a recipe with priority on tact (recipe described as "Proposal 2 with priority on tact" in FIG. 18) and a recipe with priority on split margin (recipe described as "Proposal 3 with priority on split margin" in FIG. 18) are extracted. The most recommended recipe is, for example, a recipe having the highest degree of matching with the input information (a degree of matching with the wafer processing information). The recipe with priority on tact is, for example, a recipe having a relatively high degree of matching with input information (a degree of matching with wafer processing information) and a high speed. The recipe with priority on tact of FIG. 18 is 1000 mm/sec which is faster than other recipes. The recipe with priority on the split margin is, for example, a recipe having a relatively high degree of matching with the input information (a degree of matching with the wafer processing information) and a large number of focal points. The recipe with priority on the split margin in FIG. 18 has three focal points, and the number of focal points is greater than in other recipes. The user can select a desired recipe by extracting the plurality of recipe candidates and displaying them on the display 150 in this way. The control part 8 may extract the plurality of recipe candidates from a viewpoint other than the above-described recommendations, priority on tact, and priority on split margin, and may extract the plurality of recipe candidates, for example, from the viewpoint of giving priority to quality (meandering or particle suppression).

The control part 8 may derive the degree of matching with the wafer processing information (the input information) that has received an input for each of the plurality of recipe candidates and may control the display 150 so that the plurality of recipe candidates are displayed in a display mode considering the degree of matching. Specifically, the control part 8 may control the display 150 so that, for example, the degree of matching in the plurality of recipe candidates is displayed, or the recipe candidate having a high degree of matching and the recipe candidate having a low degree of matching are displayed separately. Further, the control part 8 may control the display 150 so that a recommended order according to the degree of matching of the plurality of recipe candidates is displayed. Further, the control part 8 may control the display 150 so that a variety of information (recipe features) that can be used as a basis of determination for the user to select a recipe from the plurality of recipe candidates is displayed.

The display 150 receives a user input for selecting one recipe candidate in a state in which the plurality of recipe candidates are displayed. Then, the control part 8 may determine the recipe candidate selected in the user input received by the display 150 as the recipe (the processing conditions).

The control part 8 may additionally control the display 150 so that the determined recipe (the processing conditions) is displayed. FIG. 19 is an example of a display screen of an estimation processing result image (which will be described below). As shown in FIG. 19, when the proposed recipe is determined, the content of the proposed recipe is displayed on the display 150 together with the received wafer processing information (the input information) and the estimation processing result image (which will be described below). The content of the proposed recipe to be displayed may be some of information included in the determined recipe (the processing conditions). That is, there may be parameters that are retained internally without being displayed to the user for the recipe. In an example shown in FIG. 19, as the content of the proposed recipe, the wavelength (level 9), the pulse width (level 7), the frequency (level 12), the speed (800 mm/sec), and the like which are the irradiation conditions (the laser conditions) of the laser beam, the number of focal points (two-focal point processing) which is information related to the processing point setting/LBA setting, and the Z height (Z173, Z155) related to the formation of the two rows of modified regions SD1 and SD2 are displayed.

The control part 8 may derive an estimation processing result when the wafer 20 is irradiated with laser beam by the laser irradiation unit 3 based on the determined recipe (the processing conditions), and may control the display 150 so that an estimation processing result image which is an image of the estimation processing result is displayed. More specifically, the control part 8 is configured to derive the estimation processing result including the information of the modified region formed on the wafer 20 and the crack extending from the modified region when the wafer 20 is irradiated with laser beam by the laser irradiation unit 3 based on the set recipe and to control the display 150 so that the estimation processing result image in which an image diagram of the wafer 20 and an image diagram of the modified region and the crack in the wafer 20 are drawn together is displayed in consideration of the modified region and the position of the crack in the wafer 20 derived as the estimation processing result. More specifically, the estimation processing result is the position of the modified region, the extension amount of the crack extending from the modified region, the presence or absence of black streaks, and the like which are estimated based on the received wafer processing information (the input information) and the determined recipe. The control part 8 controls the display 150 so that the recipe (the processing conditions) and the estimation processing result image are associated with each other and displayed together.

As shown in FIG. 19, the estimation processing result image is displayed on the display 150 together with the received wafer processing information (the input information) and the recipe. In the example shown in FIG. 19, the two rows of modified regions 12*a* and 12*b* are drawn on the display 150, and the crack 14 extending over the two rows of modified regions 12*a* and 12*b* are drawn. The positions of the modified regions 12*a* and 12*b* and the crack 14 to be drawn are derived by the control part 8 based on the recipe. Now, the estimation processing result image of the display 150 shows A: BHC state (the BHC state is reached), B: No black streaks (no black streaks occur), C: 65 μm, 92 μm, 140 μm, and 171 μm (a target position of a lower end of the modified region 12*a* is 65 μm, a target position of an upper end of the modified region 12*a* is 92 μm, a target position of a lower end of the modified region 12*b* is 140 μm, and a target position of an upper end of the modified region 12*b* is 171 μm with respect to the surface 21*a*), D: 246 μm (a target position of an upper end of the crack 14 extending from the modified region 12*b* toward the back surface 21*b* is 246 μm with respect to the front surface 21*a*), E: the wafer thickness t of 775 μm (the wafer thickness is 775 μm), the finish thickness of 50 μm, and the like. Each target value such as a target position may be shown in a range having a width instead of a single point value.

The display 150 may receive an input of first correction information related to the correction of the positions of the modified regions 12*a* and 12*b* and the crack 14 displayed as the estimation processing result image in a state in which the estimation processing result image is displayed. That is, the display 150 may receive the input of the first correction information which is information for correcting the target positions of the modified regions 12*a* and 12*b* and the target position of the crack 14. In this case, the control part 8 may correct the estimation processing result based on the first correction information (that is, the information for correcting the target positions of the modified regions 12*a* and 12*b* and the target position of the crack 14), may correct various parameters of the recipe to be the corrected estimation processing result, and may control the display 150 so that the corrected recipe and the estimation processing result image based on the corrected estimation processing result are associated and displayed together.

The display 150 may receive an input of second correction information related to the correction of the recipe in the state in which the processing conditions (the recipe) are displayed. In this case, the control part 8 may correct various parameters of the recipe based on the second correction information, may correct the estimation processing result based on the corrected recipe, and may control the display 150 so that the corrected recipe and the estimation processing result image based on the corrected estimation processing result are associated with each other and displayed together.

The control part 8 may control the display 150 so that an inspection condition proposal result (refer to FIG. 19) is displayed together with the estimation processing result image. The inspection condition proposal result shows recommended inspection conditions based on the recipe and the estimation processing result image. The inspection with alphabets A to E shown in the inspection condition proposal result of FIG. 19 is an inspection corresponding to the content of A to E of the above-described estimation processing result image. That is, in the inspection condition proposal result of FIG. 19, A: BHC inspection and A: BHC margin inspection are recommended as an inspection of A: BHC state, B: black streak inspection is recommended as an inspection of B: black streak, C: SD layer position inspection is recommended as an inspection of C: modified region (SD layer) position, D: upper crack position inspection is recommended as an inspection of D: the position of upper end of the crack 14, and E: wafer thickness inspection is recommended as an inspection of E: wafer thickness. In the BHC margin inspection, a back surface state (ST or BHC) at each of the Z heights, a position of a tip end of an upper crack, an amount of change in the position of the tip end of the upper crack, a length of a lower end crack, and the like are shown. Then, as shown in FIG. 19, the user can select whether or not each of the inspections shown in the inspection condition proposal result is performed. When "start processing" shown in FIG. 19 is pressed after the inspection to be performed is selected, the processing process is started, and each of the selected inspections is performed after the processing process is completed.

The displaying of the above-described estimation processing result image will be described in more detail with reference to FIGS. 20 and 21. Here, an example of how to schematically show an actual cross-sectional state in the estimation processing result image will be described. FIG. 20(*a*) shows an actual state of various cross sections, and FIG. 20(*b*) shows an estimation processing result image of a cross section perpendicular to a processing line when the cross section is one shown in FIG. 20(*a*). FIGS. 20(*a*) and 20(*b*) show corresponding states in the upper and lower sides. As shown in FIG. 20(*b*), in the estimation processing result image of the cross section perpendicular to the processing line, the modified region (the SD layer) is indicated by an elliptical shape (or a circle), and the crack is indicated by a line, and the connection of the crack over the modified region is schematically shown. According to such an estimation processing result image, it is possible to visually express that the BHC state is reached (the leftmost one in FIG. 20(*b*)), the ST state is reached and the crack is interrupted in the middle (the second one from the left in FIG. 20(*b*)), the BHC state is reached and the crack is interrupted in the middle (the second one from the right in FIG. 20(*b*)), the BHC state is reached and an end surface is uneven (the rightmost one in FIG. 20(*b*)), and the like. Further, with respect to the unevenness of the end surface, an unevenness level can be expressed by a meandering state of the crack (the rightmost one in FIG. 20(*b*)). In this way, the control part 8 may control the display 150 so that the estimation processing result image of the cross section perpendicular to the processing line irradiated with the laser beam is displayed.

FIG. 21(*a*) shows the actual state of various cross sections, and FIG. 21(*b*) shows an estimation processing result image of a cross section horizontal to a processing line when the cross section is one shown in FIG. 21(*a*). FIGS. 21(*a*) and 21(*b*) show corresponding states in the upper and lower sides. As shown in FIG. 21(*b*), in the estimation processing result image of the cross section horizontal to the processing line, the modified region (the SD layer) is displayed in a band shape, for example. In the image of the cross section horizontal to the processing line, since the modified region can be expressed for each pulse, an image of a pulse pitch can be displayed. Since the cracks are displayed as surfaces instead of lines, the cracks are distinguished by a difference in color or the like. According to such an estimation processing result image, it is possible to visually express that the BHC state is reached (the leftmost one in FIG. 21(*b*)), the ST state is reached and the crack is interrupted in the middle (the second one from the left in FIG. 21(*b*)), the BHC state is reached and the crack is interrupted in the middle (the second one from the right in FIG. 21(*b*)), the BHC state is reached and the end surface is uneven (the rightmost one in FIG. 21(*b*)), and the like. The unevenness of the end surface can be expressed by a meandering region of the crack (the rightmost one in FIG. 20(*b*)). In this way, the control part 8 may control the display 150 so that the estimation processing result image of the cross section horizontal to the processing line irradiated with the laser beam is displayed.

(Processing Process)

In the processing process, the control part 8 controls the laser irradiation unit 3 so that the wafer 20 is irradiated with the laser beam under the determined processing conditions (the recipe). In detail, the control part 8 controls the laser irradiation unit 3 so that the wafer 20 is irradiated with the laser beam and the modified region and the crack extending from the modified region are formed in the wafer 20. The control part 8 starts the processing process according to the pressing of "start processing" (refer to FIG. 19) on the display 150.

(Processing Result Acquisition Process)

In a processing result acquisition process, the control part 8 controls the imaging unit 4 to take an image of the processed wafer 20, thereby acquiring a laser processing result of the wafer 20 due to the irradiation of the laser beam. In detail, the control part 8 outputs light having permeability to the wafer 20 and controls the imaging unit 4 to take an image of the wafer 20, thereby acquiring the laser processing result including the information of the modified region formed on the wafer 20 by the irradiation of the laser beam and the crack extending from the modified region.

As described above, after the laser processing, each of the inspections selected by the user (refer to FIG. 19) is performed. Among each of the inspections, E: wafer thickness inspection (derivation of wafer thickness) will be described with reference to FIGS. 22 and 23. The inspection device 1 can measure the thickness of the wafer 20 based on information obtained by the laser processing by the laser irradiation unit 3 and an internal observation process by the imaging unit 4. Specifically, the control part 8 performs a first process of controlling the laser irradiation unit 3 so that the modified region is formed inside the wafer 20 by irradiating the wafer 20 with the laser beam, and a second process of deriving the position of the modified region based on a signal output from the imaging unit 4 that detects the light propagating on the wafer 20 and deriving the thickness of the wafer 20 based on the derived position of the modified region and the set recipe (the processing conditions).

FIG. 22 is a diagram showing the derivation of the wafer thickness. In FIG. 22, it is shown that the modified region 12*a* is formed by radiating the laser beam from the back surface 21*b* side of the wafer 20. The control part 8 acquires a plurality of images by controlling the imaging unit 4 to move the focal point F in a depth direction (the Z direction), and derives a: Z position of the upper end of the modified region 12*a* (SD1) and c: Z position of a virtual image of an end portion of the modified region 12*a* (SD1) on the front surface 21*a* side from the image. That is, in the above-described second process, the control part 8 derives a Z position (a position a) of the end portion of the modified region 12*a* on the back surface 21*b* side and a Z position (a position c) of a virtual image of the end portion of the modified region 12*a* on the front surface 21*a* side based on the signal output from the imaging unit 4 that has detected the light. Further, when the wafer 20 is a wafer having the functional element layer 22 (the pattern), the control part 8 can control the imaging unit 4 to move the focal point F in the depth direction (the Z direction) and to derive b: Z position of a pattern surface. In the following, the Z positions are assumed to be positions with the back surface 21*b* of the wafer 20 as a reference point. The Z position of the wafer 20 which is the reference point may be derived, for example, by recognizing a crack extending to the back surface 21*b* side with the imaging unit 4 (a detector for internal observation) or a visible camera for height set, may be derived by recognizing the crack with a visible camera for height setting when the Z height is set before the laser processing, and may be derived by measuring a focus position of the pattern at the time of alignment before the laser processing or at the time of internal observation after the laser processing when the laser beam is incident from the pattern surface.

The control part 8 can derive the thickness of the wafer 20 by a three-pattern derivation method. In a first method, the control part 8 derives the thickness of the wafer 20 based on b: the Z position of the pattern surface. The first method can be used only when the wafer 20 is a wafer having functional element layer 22 (pattern) as described above. In a second method and a third method, the control part 8 derives the thickness of the wafer 20 based on c: the Z position of the virtual image of the end portion of the modified region 12*a* (SD1) on the front surface 21*a* side and the recipe.

In the second method, the control part 8 first derives a width of the modified region 12*a* based on the recipe. Specifically, the control part 8 stores, for example, a database related to the derivation of the wafer thickness (a database in which the processing conditions and the width of the modified region are associated with each other) as shown in FIG. 23 and derives the width of the modified region 12*a* (the width of the SD layer) corresponding to energy of the laser beam, the pulse waveform, the pulse pitch, and the condensing state shown in the recipe (the processing conditions) by referring to the database. Then, the control part 8 derives the thickness of the wafer 20 based on the derived width of the derived modified region 12*a, c*: the Z position of the virtual image of the end portion of the modified region 12*a* (SD1) on the front surface 21*a* side, and a: the Z position of the upper end of the modified region 12*a* (SD1). As shown in FIG. 22, when the derived width of the modified region 12, c: the Z position of the virtual image of the end portion of the modified region 12*a* (SD1) on the front surface 21*a* side, and a: the Z position of the upper end of the modified region 12*a* (SD1) are added, a value thereof is twice the thickness of the wafer 20. Therefore, the control part 8 can derive the thickness of the wafer 20 by dividing the value obtained by adding the width of the modified region 12, c: the Z position of the virtual image of the end portion of the modified region 12*a* (SD1) on the front surface 21*a* side, and a: the Z position of the upper end of the modified region 12*a* (SD1) by 2.

In the third method, the control part 8 is, first, derives an estimated end position which is the position of the end portion of the modified region 12*a* on the front surface 21*a* side and is estimated from the Z height that is a processing depth of the laser beam with respect to the wafer 20, based on the recipe. The control part 8 derives the position of the end portion in consideration of a DZ rate (the position of the end portion of the modified region 12*a* on the front surface 21*a* side in consideration of the DZ rate) based on the estimated position of the end portion and a constant (the DZ rate) considering a refractive index of the silicon of the wafer 20, and derives the thickness of the wafer 20 based on the position of the end portion in consideration of the DZ rate and c: the Z position of the virtual image of the end portion of the modified region 12*a* (SD1) on the front surface 21*a* side. As shown in FIG. 22, when the position of the end portion in consideration of the DZ rate and c: the Z position of the virtual image of the end portion of the modified region 12*a* (SD1) on the front surface 21*a* side are added, a value thereof is twice the thickness of the wafer 20. Therefore, the control part 8 can derive the thickness of the wafer 20 by dividing the value obtained by adding the above-described position of the end portion in consideration of the DZ rate and c: the Z position of the virtual image of the end portion of the modified region 12*a* (SD1) on the front surface 21*a* side by 2.

A determination result of each of the inspections includes information of the laser processing result acquired by the control part 8. In the following, it is assumed that the "inspection determination result" includes the information of the "laser processing result". FIG. 24 is an example of a display screen of the inspection determination result (NG). As shown in FIG. 24, the control part 8 controls the display 150 so that the inspection determination result including the information of the laser processing result is displayed. As shown in FIG. 24, the control part 8 may control the display 150 so that the estimation processing result image and the inspection determination result including the information of the laser processing result are associated with each other and displayed together.

As shown in FIG. 24, the estimation processing result image of the display 150 shows A: BHC state (the BHC state is reached), B: no black streaks (no black streaks occur), C: 65 μm, 92 μm, 140 μm, and 171 μm (a target position of the lower end of the modified region 12*a* is 65 μm, a target position of the upper end of the modified region 12*a* is 92 μm, a target position of the lower end of the modified region 12*b* is 140 μm, and a target position of the upper end of the modified region 12*b* is 171 μm with respect to the front surface 21*a*), D: 246 μm (a target position of the upper end of the crack 14 extending from the modified region 12*b* toward the back surface 21*b* is 246 μm with respect to the front surface 21*a*), E: the wafer thickness t of 775 μm (the wafer thickness is 775 μm), and the finish thickness of 50 μm. When the laser processing was performed according to the recipe, it was assumed that the estimation processing result image would be obtained. However, the inspection determination result shows A: ST (ST state), B: no black streaks, C: 74 μm, 99 μm, 148 μm, and 174 μm (a position of the lower end of the modified region 12*a* is 74 μm, a position of the upper end of the modified region 12*a* is 99 μm, a position of the lower end of the modified region 12*b* is 148 μm, and a position of the upper end of the modified region 12*b* is 174 μm with respect to the front surface 21*a*), D: 211 μm (a position of the upper end of the crack 14 extending from the modified region 12*b* toward the back surface 21*b* is 211 μm with respect to the front surface 21*a*), E: the wafer thickness of 783 μm (wafer thickness is 783 μm), and the finish thickness of 50 μm.

(Processing Condition Evaluation Process)

The control part 8 evaluates the recipe (the processing conditions) based on the inspection determination result (refer to FIG. 24) including the information of the laser processing result. Specifically, the control part 8 evaluates validity of the recipe by comparing the inspection determination result including the information of the laser processing result with the estimation processing result considering the recipe determined based on the wafer processing information. Now, as shown in FIG. 24, there is a discrepancy between the target value of the estimation processing result image and the value of the inspection determination result, and among the inspections selected by the user (refer to FIG. 19), at least A: BHC inspection, C: SD layer position inspection, D: upper crack position inspection, and E: wafer thickness inspection are NG. It is conceivable that the reason why the ST instead of the BHC is reached is that, as the inspection determination result shows E: wafer thickness t of 783 μm, the wafer thickness (775 μm) set by the user is not correct, a formation position of the modified region is shifted in a shallow direction due to the wafer 20 being thicker than expected, the modified region is thinner than expected, and the like. In such a case, the control part 8 evaluates that the recipe (the processing conditions) is not appropriate. The control part 8 may determine whether the misalignment factor of the modified region (the SD layer) is due to hardware or recipe based on other data such as AF followability. Here, although the example in which a factor that causes the inspection to be NG is the wafer thickness has been described, it is conceivable that the inspection become NG due to various factors such as a hardware difference, insufficient margin of the recipe on the database, and wafer doping.

When the control part 8 evaluates that the recipe (the processing conditions) is not appropriate, the control part 8 may further perform correction of the recipe (the processing conditions) based on the inspection determination result including the information of the laser processing result. For example, when it is considered that the fact that the wafer 20 is thicker than expected is served as a factor of the inspection NG as described above, the control part 8 performs Z height correction, output correction, and correction of light concentration correction amount, and determines that the recipe is corrected while the BHC margin inspection is performed as correction contents. As shown in FIG. 24, the control part 8 controls the display 150 so that the recommended correction content is displayed together with the inspection determination result. The control part 8 may control the display 150 so that priority of each of the correction contents is displayed. The display 150 may receive a user input such as a change in the priority and a partial deletion of the correction contents. The control part 8 starts a correction process displayed on the display 150 in accordance with the pressing of "correction start" (refer to FIG. 24) on the display 150. In the case of the above-described situation (the wafer 20 is thicker than expected), for example, corrections such as a change to lower the Z height to a deeper position by a thickness of the wafer and a change to increase the output by 0.1 W are performed to secure the width of the modified region. Then, for example, when the margin is small as a result of a BHC margin inspection, the light concentration correction amount is adjusted to improve light concentration property. Due to such processes, the control part 8 derives a final (corrected) recipe.

FIG. 25 is an example of a display screen of the inspection determination result (OK). As shown in FIG. 25, the control part 8 controls the display 150 so that the estimation processing result image, the inspection determination result, and the corrected recipe (the processing conditions) are displayed together after the correction is performed. In the example of FIG. 25, the inspection determination result shows A: BHC (the BHC state is reached), B: no black streaks, C: 64 μm, 93 μm, 142 μm, and 173 μm (a position of the lower end of the modified region 12*a* is 64 μm, a position of the upper end of the modified region 12*a* is 93 μm, a position of the lower end of the modified region 12*b* is 142 μm, and a position of the upper end of the modified region 12*b* is 173 μm with respect to the front surface 21*a*), D: 244 μm (a position of the upper end of the crack 14 extending from the modified region 12*b* toward the back surface 21*b* is 244 μm with respect to the front surface 21*a*), E: the wafer thickness t of 783 μm (the wafer thickness is 783 μm), and the finish thickness of 50 μm. In this way, the determination result of each of the inspections is OK by performing the correction in consideration of the wafer thickness which is different from expected. Then, when the recipe (the processing conditions) is corrected, the control part 8 updates the database in which the wafer processing information and the processing condition (the recipe) are stored in association with each other, based on the information including the corrected recipe. For example, when the recipe of the wafer thickness (783 μm) shown in the inspection determination result is not present in the database, the control part 8 newly registers the corrected recipe as the recipe of the wafer thickness (783 μm) in the database. When a new recipe is registered in the database, names of the user's original wafer and processing conditions can be registered, and thus it is possible to call the recipe on the database from the names when a similar wafer is processed. In addition, the control part 8 improves recipe determination accuracy from the next time onward by accumulating the result of the inspection NG in the database.

[Inspection Method]

An inspection method of the present embodiment will be described with reference to FIG. 26. FIG. 26 is a flowchart of the inspection method. FIG. 26 is a flowchart showing a processing condition derivation process performed as a preprocessing of a process of forming a modified region in the wafer 20 among the inspection methods performed by the inspection device 1.

As shown in FIG. 26, in the processing condition derivation process, first, the display 150 receives a user input of the wafer processing information including the information of the wafer 20 and the laser processing target for the wafer 20 (Step S1, a first step). Specifically, the display 150 receives an user input for the processing method shown in FIG. 13, the wafer information shown in FIG. 14, and the processing setting shown in FIG. 15.

Subsequently, the control part 8 determines (automatically selects) a recipe (processing conditions) corresponding to the wafer processing information (a variety of information received on the setting screen of FIGS. 13 to 15) received through the display 150 by referring to the database and controls the display 150 so that the automatically selected recipe is displayed (proposed) (Step S2, a second step). The display 150 displays a recipe, an estimation processing result image, inspection conditions, and the like (refer to FIG. 19). Then, when the user presses "start processing" of the display 150, a recipe is determined (Step S3), and a processing process of irradiating the wafer 20 with a laser beam based on the determined recipe is started (Step S4, a third step).

Subsequently, the control part 8 evaluates the recipe (the processing conditions) based on the inspection determination result (refer to FIG. 24) including the information of the laser processing result (a fourth step) and determines whether or not the recipe is appropriate (whether or not the evaluation is OK) (Step S5). When it is determined in Step S5 that the recipe is not appropriate (evaluation NG), the recipe is automatically corrected based on the inspection determination result (Step S6). For example, when it is considered that the fact that the wafer 20 is thicker than expected is served as a factor of NG, the control part 8 performs the Z height correction, the output correction, the correction of the light concentration correction amount, and the like. Then, it is carried out again from the processing process of Step S4.

On the other hand, when it is determined in Step S5 that the recipe is appropriate (evaluation OK), it is determined whether or not the recipe has been changed even once (whether or not the correction process of Step S6 has been performed) (Step S7), and when the recipe has been changed, a changed recipe (a new recipe) is registered in the database (Step S8), and the process ends.

[Operation and Effect]

Next, an operation and effect of the inspection device 1 according to the present embodiment will be described.

The inspection device 1 according to the present embodiment includes the laser irradiation unit 3 that irradiates the wafer 20 having the back surface 21b and the front surface 21a with a laser beam from the back surface 21b side of the wafer 20, the imaging unit 4 that outputs light having permeability to the wafer 20 and detects the light propagating through the wafer 20, and the control part 8 configured to perform a first process of controlling the laser irradiation unit 3 so that the modified region is formed inside the wafer 20 by irradiating the wafer 20 with the laser beam, and a second process of deriving the position of the modified region based on the signal output from the imaging unit 4 that has detected the light, and deriving the thickness of the wafer 20 based on the derived position of the modified region and the set recipe.

In the inspection device 1 according to the present embodiment, the thickness of the wafer 20 is derived based on the position of the modified region formed by irradiating the wafer 20 with the laser beam and the set recipe. The position of the modified region is determined based on the recipe and the thickness of the wafer 20. Therefore, when the position of the modified region and the recipe are known, the thickness of the wafer 20 can be derived. As in the inspection device 1, the thickness of the wafer 20 can be derived with high accuracy by deriving the thickness of the wafer 20 from the position of the modified region actually imaged and the set recipe.

In the second process, the control part 8 may derive the position of the virtual image of the end portion of the modified region on the front surface 21a side based on the signal output from the imaging unit 4 that has detected the light and may derive the thickness of the wafer 20 based on the position of the virtual image and the recipe. In order to derive the position of the modified region, it is necessary to derive the position of the end portion of the modified region on the front surface 21a side. However, when the laser beam is radiated from the back surface 21b side of the wafer 20, the position cannot be confirmed even when the position of the end portion on the front surface 21a side of the modified region is focused. In this respect, since the position of the virtual image of the end portion of the modified region of the front surface 21a side can be derived, the position of the modified region can be estimated based on the position of the virtual image. Thus, the thickness of the wafer 20 can be appropriately derived.

In the second process, the control part 8 may further derive the position of the end portion of the modification region on the back surface 21b side based on the signal output from the imaging unit 4 that has detected the light, may further derive the width of the modified region based on the recipe, and may derive the thickness of the wafer 20 based on the position of the virtual image of the end portion of the modified region on the front surface 21a side, the position of the end portion thereof on the back surface 21b side, and the width of the modified region. The total of the position of the virtual image of the end portion of the modified region on the front surface 21a side, the position of the end portion thereof on the back surface 21b side, and the width of the modified region is twice the thickness of the wafer 20. Therefore, the thickness of the wafer 20 can be appropriately derived by deriving the position of the virtual image of the end portion of the modified region on the front surface 21a side, the position of the end portion thereof on the back surface 21b side, and the width of the modified region.

The control part 8 may store a database in which the recipe and the width of the modification region are associated with each other, and in the second process, the control part 8 may derive the width of the modified region corresponding to the recipe by referring to the database. Since the width of the modified region varies according to the recipe, the width of the modified region can be easily and highly accurately derived by deriving the width of the modified region by referring to the database in which the width of the modified region and the recipe are associated with each other.

In the second process, the control part 8 derives the position of the end portion (the position of the end portion of the modified region on the front surface 21a side in consideration of the DZ rate) in consideration of the DZ rate based on the estimated end position that is the position of the end portion of the modified region on the front surface 21a side and is estimated from the processing depth of the laser beam with respect to the wafer 20, and the constant (the DZ rate) considering the refractive index of the wafer 20 which are included in the recipe, and may derive the thickness of the wafer 20 based on the position of the virtual image of the end portion of the modified region on the front surface 21a side and the position of end portion in consideration of the DZ rate. A value obtained by adding a value (the position of the end portion considering the DZ rate) considering the refractive index of the wafer 20 with respect to the position of the end portion of the modified region on the front surface 21a side that is estimated from a processing depth of the laser beam included in the recipe and the position of the virtual image of the end portion of the modified region on the front surface 21a side is twice the thickness of the wafer 20. Therefore, the thickness of the wafer 20 can be appropriately derived by deriving the position of the virtual image of the end portion of the modified region on the front surface 21a side and the position of the end portion in consideration of the DZ rate.

Although the present embodiment has been described above, the present invention is not limited to the above embodiment. For example, as shown in FIG. 1, the example in which the inspection device 1 has the display 150 for displaying the estimation processing result image and the like has been described, but the present invention is not limited thereto, and like an inspection device 1A shown in FIG. 27, the inspection device 1 may not have a display. The inspection device 1A has the same configuration as the inspection device 1 except that it does not have a display. In this case, the control part 8 of the inspection device 1A outputs (transmits) an estimation processing result image in which an image diagram of the wafer and an image diagram of the modified region and the crack in the wafer are drawn together, for example, in consideration of the modified region derived as the estimation processing result and the position of the crack in the wafer to an external device or the like. Then, the estimation processing result image and the like may be displayed not by the inspection device 1A but by an external device. That is, the estimation processing result image and the like may be displayed on another device (PC or the like) capable of communicating with the inspection device 1A. Thus, even when the inspection device 1A does not have a display, it is possible to display the estimation processing result image and the like on another device or the like capable of communicating with the inspection device 1A.

Further, as shown in FIG. 28, the estimation processing result image may be generated and displayed in a process system 600 having the above-described inspection device 1A and a dedicated display device 550. In this case, the control part 8 of the inspection device 1A transmits to the display device 550 an estimation processing result image and the like in which an image diagram of the wafer and an image diagram of the modified region and crack in the wafer are drawn together, for example, in consideration of the modified region derived as the estimation processing result and the position of the crack in the wafer. The display device 550 displays the estimation processing result image and the like received from the inspection device 1A. According to such a process system 600, the estimation processing result image and the like transmitted by the inspection device 1A can be appropriately displayed through the display device 550 which is an external device.

Further, in the embodiment, it has been described that the display displays the estimation processing result image in which the image diagram of the wafer and the image diagram of the modified region and the crack in the wafer are drawn together, but the present invention is not limited thereto. That is, the control part does not necessarily have to display the above-described estimation processing result image on the display, may derives, for example, an estimation processing result including information on the modified region formed in the wafer and the crack extending from the modified region, and may control the display so that the information related to the estimation processing result is displayed. The information related to the estimation processing result does not have to be an image diagram of the wafer, the modified region, the crack, and the like, but may simply be information indicating the modified region, the position of the crack, or the like (that is, it does not have to include the image diagram).

Further, in the processing condition derivation process, it has been described that the above-described display process of the estimation processing result image and the derivation process of the wafer thickness are performed, but the display process of the estimation processing result image and the derivation process of the wafer thickness may be performed in a process other than the processing condition derivation process, for example, various processes after the processing conditions are derived.

Further, in the embodiment, it has been described that the inspection device 1 determines the recipe (the processing conditions) based on the wafer processing information and derives the estimation processing result, but the present invention is not limited thereto. That is, the control part of the inspection device may derive the estimation processing result based on the wafer processing information and may determine the recipe (the processing conditions) based on the estimation processing result. For example, the processing conditions can be easily determined by inputting the wafer processing information and thus automatically determining the processing conditions in this way, as compared with the case in which the laser processing process is repeatedly performed while the user adjusts the processing conditions to derive appropriate processing conditions.

REFERENCE SIGNS LIST

1, 1A Inspection device
3 Laser irradiation unit
4 Imaging unit
8 Control part
20 Wafer
150 Display

The invention claimed is:

1. An inspection device comprising:
an irradiation unit configured to irradiate a wafer having a first surface and a second surface with a laser beam from a first surface side of the wafer;
an imaging unit configured to output light having permeability to the wafer and to detect the light propagating through the wafer; and
a control part configured to perform a first process of controlling the irradiation unit so that a modified region is formed inside the wafer by irradiating the wafer with the laser beam, and a second process of deriving a position of the modified region based on a signal output from the imaging unit that has detected the light and deriving a thickness of the wafer from the first surface to the second surface based on the derived position of the modified region and set processing conditions,
wherein, in the second process, the control part derives a position of a virtual image of an end portion of the modified region on a second surface side based on a signal output from the imaging unit that has detected the light and derives a thickness of the wafer based on the position of the virtual image and the processing conditions.

2. The inspection device according to claim 1, wherein, in the second process, the control part further derives a position of an end portion of the modified region on the first surface side based on the signal output from the imaging unit that has detected the light, further derives a width of the modified region based on the processing conditions, and derives a thickness of the wafer based on the position of the virtual image of the end portion of the modified region on the second surface side, the position of the end portion of the modified region on the first surface side, and the width of the modified region.

3. The inspection device according to claim 2, wherein the control part stores a database in which the processing conditions and the width of the modified region are associated with each other, and in the second process, the control part derives the width of the modified region corresponding to the processing conditions by referring to the database.

4. The inspection device according to claim 1, wherein, in the second process, the control part derives a constant consideration end position based on an estimated position of the end portion that is a position of the end portion of the modified region on the front surface side and is estimated from a processing depth of the laser beam with respect to the wafer, and a constant considering a refractive index of the wafer which are included in the recipe, and derives a thickness of the wafer based on the position of the virtual image of the end portion of the modified region on the second surface side and the end portion considering the constant.

5. An inspection method comprising:
a first step of preparing a wafer having a first surface and a second surface and forming a modified region inside the wafer by irradiating the wafer with a laser beam;
a second step of outputting light having permeability to the wafer in which the modified region is formed by the first step and detecting light propagating through the wafer; and
a third step of deriving a position of the modified region based on the light detected in the second step, and deriving a thickness of the wafer from the first surface to the second surface based on the derived position of the modified region and set processing conditions,
wherein, in the third step a position of a virtual image of an end portion of the modified region on a second surface side is derived based on the detected light, and a thickness of the wafer is derived based on the position of the virtual image and the processing conditions.

* * * * *